United States Patent
Steinmacher-Burow

(10) Patent No.: US 10,114,772 B1
(45) Date of Patent: *Oct. 30, 2018

(54) ADDRESS LAYOUT OVER PHYSICAL MEMORY

(71) Applicant: International Business Machines Corporation, Armonk, NY (US)

(72) Inventor: Burkhard Steinmacher-Burow, Esslingen am Neckar (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/797,319

(22) Filed: Oct. 30, 2017

Related U.S. Application Data

(63) Continuation of application No. 15/689,680, filed on Aug. 29, 2017.

(51) Int. Cl.
*G11C 8/00* (2006.01)
*G06F 13/16* (2006.01)
*G11C 5/04* (2006.01)
*G06F 12/10* (2016.01)
*G06F 12/06* (2006.01)

(52) U.S. Cl.
CPC ............ *G06F 13/1684* (2013.01); *G11C 5/04* (2013.01); *G06F 12/0607* (2013.01); *G06F 12/10* (2013.01)

(58) Field of Classification Search
CPC .. G06F 13/1684; G06F 12/0607; G06F 12/10; G11C 5/04

USPC ..................................................... 365/230.03
See application file for complete search history.

(56) References Cited

U.S. PATENT DOCUMENTS

| | | | |
|---|---|---|---|
| 8,819,359 B2 | 8/2014 | Kapil et al. | |
| 9,146,864 B2 | 9/2015 | Retter et al. | |
| 2010/0318741 A1 | 12/2010 | Scott et al. | |
| 2015/0089168 A1 | 3/2015 | Kalyanasundharam et al. | |
| 2015/0089183 A1 | 3/2015 | Bains et al. | |
| 2016/0210241 A1 | 7/2016 | Jacobs et al. | |
| 2016/0371185 A1* | 12/2016 | Brewer | G06F 12/04 |

OTHER PUBLICATIONS

Ghasempour et al., "DReAM: Dynamic Re-arrangement of Address Mapping to Improve the Performance of DRAMs", Proceedings of the Second International Symposium on Memory Systems, Oct. 3-6, 2016, Washington, DC, USA, 12 pages.

(Continued)

*Primary Examiner* — Fernando Hidalgo
(74) *Attorney, Agent, or Firm* — Stosch Sabo

(57) ABSTRACT

An address translation device (ATD) can be used to translate a physical address of a memory line to a storage location within a main memory. The main memory can include multiple memory devices, each including at least one memory portion. Each of the memory portions can be contiguous and have a uniform size. The memory line can be stored within one of the memory portions. The ATD can include a data table structure. Consecutive rows of the data table structure can be configured such that each of the rows uniquely identifies one of the memory portions. The ATD can also include an index calculation unit configured to calculate a row index. The row index can be used to identify the row of the data table structure that identifies the memory portion that includes the storage location of the memory line.

14 Claims, 15 Drawing Sheets

(56) References Cited

OTHER PUBLICATIONS

Compaq, "AlphaServer ES40", Service Guide, Compaq Computer Corporation, First Printing, Jul. 1999, 444 pages.
Wikipedia, "Memory geometry", From Wikipedia, the free encyclopedia, last edited on Jun. 14, 2017, printed Jul. 14, 2017, 5 pages.
Wikipedia, "Memory rank", From Wikipedia, the free encyclopedia, last edited on May 14, 2017, printed Jul. 14, 2017, 2 pages.
Intel, "Intel® Server Board S2600WT", Technical Product Specification (TPS), Revision 1.4, Jun. 2016, Intel® Server Boards and Systems, 178 pages.
Jeong, "Core-characteristic-aware Off-chip Memory Management in a Multicore System-on-Chip", Dissertation, Presented to the Faculty of the Graduate School of the University of Texas at Austin, Dec. 2012, 137 pages.
Caldeira et al., "IBM Power Systems E870 and E880 Technical Overview and Introduction", IBM, Redbooks Dec. 2014, 216 pages.
Caldeira et al., "IBM Power Systems S814 and S824 Technical Overview and Introduction" IBM, Redbooks, Aug. 2014, 194 pages.
Intel, "MCA Enhancements in Future Intel® Xeon® Processors", Jun. 2013, Reference No. 329176-001, Revision: 1.0,16 pages.
Pessl et al., "DRAMA: Exploiting DRAM Addressing for Cross-CPU Attacks", Original publication in the Proceedings of the 25th Annual USENIX Security Symposium (USENIX Security 2016), Jun. 28, 2016, 17 pages.
Intel, "Intel Compute Module MFS2600KI", Technical Product Specification, Intel order No. G51989-002, Revision 1.0, Jun. 2012, 67 pages.
Schopp et al., "Hotplug Memory Redux", Proceedings of the Linux Symposium, vol. Two, Jul. 20-23, 2005, Ottawa, Ontario, Canada, 26 pages.
Kim et al., "Flipping Bits in Memory Without Accessing Them: An Experimental Study of DRAM Disturbance Errors", Work done while at Carnegie Mellon University, Copyright 2014 IEEE, 12 pages.
Schirmeier et al., Efficient Online Memory Error Assessment and Circumvention for Linux with RAMpage, Int. J. Critical Computer-Based Systems, vol. 4, No. 3, 21 pages.
Kleen, A., "mcelog: memory error handling in user space", 7 pages.
Henderson, "POWER8® Processor-Based Systems RAS", Introduction to Power Systems™ Reliability, Availability, and Serviceability, IBM Systems and Technology Group, Jun. 8, 2017, 90 pages.
Colglazier et al., "Maximizing System Performance with a Balanced Memory Configuration", Lenovo, © Copyright Lenovo 2016, 19 pages.
Intel, "Intel Xeon Processor E5 v4 Product Family", Datasheet vol. 2: Registers, Jun. 2016, 408 pages.
Song et al., "Plkit: A New Kernel-Independent Processor-Interconnect Rootkit", USENIX Security Symposium 2016, System Security Lab, 30 pages.
Hall, M., "The IBM z990 Processor", Technical Overview, Part 2, CMGA Sydney, Sep. 4, 2003, 24 pages.
Unknown, "Advanced Configuration and Power Interface Specification", Version 6.1, Jan. 2016, 1082 pages.
Steinmacher-Burow, B., "Address Layout Over Physical Memory", U.S. Appl. No. 15/689,680, filed Aug. 29, 2017.
IBM, List of IBM Patents or Patent Applications Treated as Related, Oct. 27, 2017, 2 pages.

\* cited by examiner

ADDRESS LAYOUT OVER PHYSICAL MEMORY

BACKGROUND

The present disclosure relates to the field of computer systems and more specifically to an address translation device for address layout over physical memory in a computer system. Embodiments can also include a method and a computer program product for address translation.

Modern computer systems generally include a main memory which may have at least one memory device. In order to access data stored in the main memory, physical addresses within a physical address space are used. Each physical address is represented in the form of a binary number which is used to identify/locate data stored in the main memory. In order to access data stored in one of the memory devices of the main memory, the physical address can be translated to the location of the data within one of the memory devices used in the computer system main memory. Thus, there can be a need to continuously improve the translation of physical addresses to memory locations within the main memory in order to improve the speed and efficiency of reading and writing data in the main memory.

SUMMARY

Embodiments may be directed towards an address translation device for a computer system used for translating a physical address of a memory line to a storage location of the memory line within a main memory of the computer system. Some embodiments can also include a method for translating a physical address of a memory line to a storage location of the memory line within a main memory of a computer system. Some embodiments can also include a computer program product comprising a computer-readable non-volatile storage medium containing computer-readable program code. The computer-readable program code can be configured for implement a method for translating a physical address of a memory line to a storage location of the memory line within a main memory of the computer system. Embodiments of the present disclosure can be freely combined with each other if they are not mutually exclusive.

Embodiments may be directed towards an address translation device (ATD) configured to translate, within a main memory of a computer system, a physical address of a memory line to a storage location of the memory line. The main memory can include a plurality of memory devices, each memory device of the plurality memory devices having a respective memory capacity. Each of the respective memory capacities can include at least one contiguous memory portion of a uniform size, the memory line being stored in one of the at least one contiguous memory portions. The ATD can include a first data table structure having a set of consecutive rows, each row of the set of consecutive rows configured to uniquely identify one of the at least one contiguous memory portions. The ATD can also include a first index calculation unit configured to calculate, for the physical address, a first row index. The first row index can identify a row of the first data table structure that identifies a memory portion, of the at least one contiguous memory portions, that includes the storage location of the memory line.

Embodiments may also be directed towards a computer program product for translating, within a main memory of a computer system, a physical address of a memory line to a storage location of the memory line. The main memory can include a plurality of memory devices, each memory device of the plurality memory devices having a respective memory capacity. Each of the respective memory capacities can include at least one contiguous memory portion of a uniform size, the memory line being stored in one of the at least one contiguous memory portions. The computer program product can include at least one computer-readable storage medium having program instructions embodied therewith, the program instructions executable by at least one computer processor circuit to cause the at least one computer processor circuit to perform a method. The method can include calculating, with a first index calculation unit, for the physical address, a first row index that identifies a row of the first data table structure that identifies a memory portion, of the at least one contiguous memory portions, that includes the storage location of the memory line. The method can also include accessing the row identified by the first row index, the row including at least one field value for calculating the storage location of the memory line within the main memory. The method can also include calculating, with the first index calculation unit and using the at least one field value, the storage location of the memory line within the main memory.

Embodiments may also be directed towards a method for translating, within a main memory of a computer system, a physical address of a memory line to a storage location of the memory line. The main memory can include a plurality of memory devices, each memory device of the plurality memory devices having a respective memory capacity. Each of the respective memory capacities can include at least one contiguous memory portion of a uniform size, the memory line being stored in one of the at least one contiguous memory portions. The method can include calculating, with a first index calculation unit, for the physical address, a first row index that identifies a row of the first data table structure that identifies a memory portion, of the at least one contiguous memory portions, that includes the storage location of the memory line. The method can also include accessing the row identified by the first row index, the row including at least one field value for calculating the storage location of the memory line within the main memory. The method can also include calculating, with the first index calculation unit and using the at least one field value, the storage location of the memory line within the main memory.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
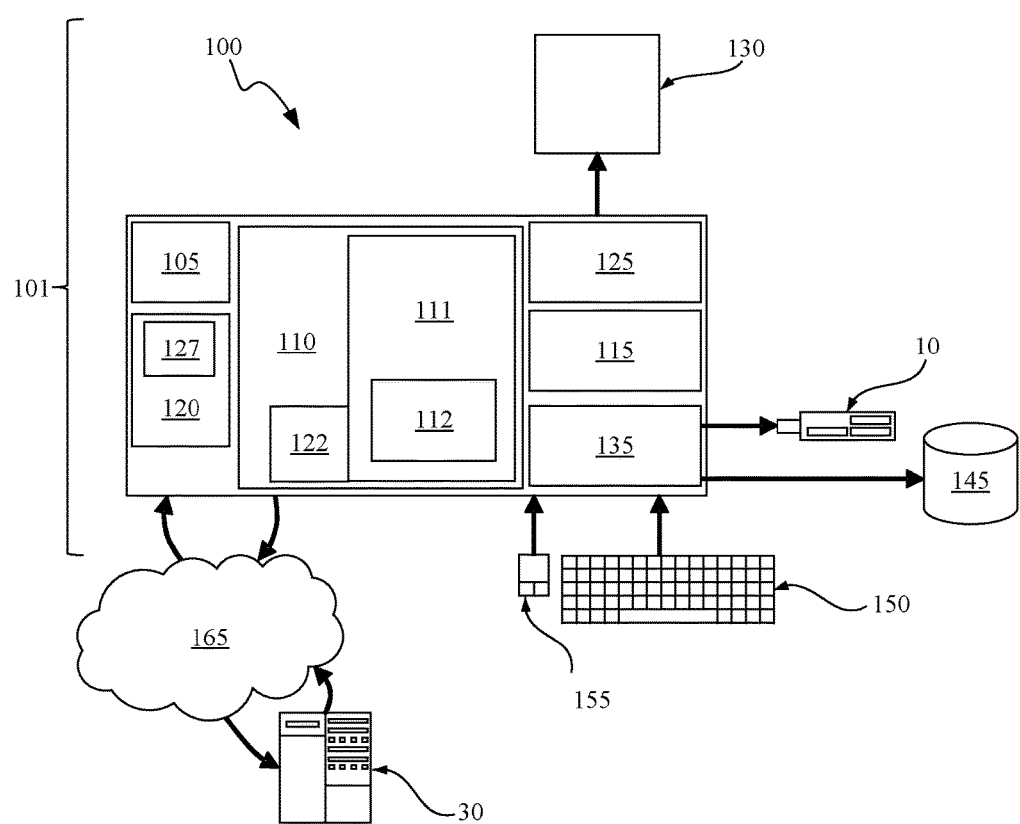
FIG. 1 is a schematic diagram of a computer system configured for implementing embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

The descriptions of the various embodiments of the present disclosure are being presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Embodiments can provide a fast and efficient mechanism for translating physical addresses to locations within a main memory of a computer system that includes multiple memory devices. This translation may particularly account for the configuration of a main memory that includes multiple memory devices. The translation may also account for the capacities and/or states of the individual memory devices. A fine granular translation can be enabled on the level of single memory lines, i.e., physical addresses and locations of individual memory lines that can be stored, independent of each other, in different portions of different memory devices.

A memory line, also known as a "cache line", is data block of fixed size that is transferred between memory and cache. When a memory line is copied from main memory into a cache of a processor chip, a cache entry is created. The memory line may e.g., include a memory hub chip or memory buffer chip. The memory hub chip may include a coherence directory for implementing directory-based coherence of memory lines stored in memory devices local to the memory hub chip, i.e., they may only be accessed through the respective memory hub chip. Memory lines may can also be stored in memory devices local to a processor chip, i.e., they may only be accessed through the respective processor chip.

When a processor chip needs to read or write a location in main memory, it may check for a corresponding entry in the cache using a physical address of the data to be read or written. The cache may check for the contents of the respective data in any cache lines that might be assigned with that physical address. If the processor finds that the data with the respective physical address is in the cache, a cache hit has occurred. If the processor does not find the data with the respective physical address in the cache, a cache miss has occurred. In the case of a cache hit, the processor may directly read or write the data in the cache line. For a cache miss, the cache allocates a new entry and copies data from main memory using the physical address to identify and locate the data to be read or write. The processor can then use the copy of the respective data in the cache. The data may include at least one memory line, e.g., a memory page, and can thus be assigned with at least one physical address.

The first data table structure can implement a mapping of the physical address space to locations within the main memory such that a contiguous part of the physical address space is mapped to a contiguous portion of the main memory included within a single memory device. Alternatively, the physical addresses can be mapped to the main memory such that successive physical addresses are mapped to different memory portions, and particularly to different memory portions of the same memory devices or to different memory portions of different memory devices. A memory portion is a portion of the main memory including a memory device. Each memory device may include at least one memory portion, i.e., the memory capacity of a memory device may include at least one memory portion. Storing different memory lines in different memory devices may allow parallel and/or concurrent access to the memory lines by accessing the different memory devices in parallel. A memory device may include at least one memory component, and each memory component may be individually accessible. Distributing data of a contiguous part of the physical address space over multiple memory components of a memory device, e.g., in form of single memory lines, can allow access to the data by parallel access of multiple memory components and parallel retrieval of multiple memory lines.

The first row index calculation unit can include firmware and/or hardware. If the unit includes hardware, the first row index calculation unit may include logic circuits implementing a function for deriving locations within the main memory from physical addresses. The address translation device may also include machine-readable instructions embodied in the form of firmware or hardware, i.e., the respective logic circuits.

In order to access a location within the main memory based on a physical address corresponding to a memory line, the first row index calculation unit may calculate the first row index of a row of the first data table structure. The row of the first row index may include a memory device identifier that identifies the memory device including the memory portion holding the memory line of the respective physical address. The memory can include a single memory component or a set, e.g., pair, of memory components. The row may also include a memory portion identifier that identifies the memory portion of the memory device that holds the requested memory line. An offset of the memory line within the memory portion can also be calculated by using the physical address. By using the offset and the identified portion, the line's location in the memory device may be calculated. Thus, the precise location, e.g., the location where the memory line starts, within a distributed main memory can be identified. The respective location identified using the first data table structure may be accessed in order to retrieve or to store the respective memory line from/to the respective location.

Embodiments may allow for interleaving memory lines across multiple memory devices, e.g., over all memory devices of the main memory, where each memory line stored in a single one of the main memory devices. Thus, a high-bandwidth memory interface can be enabled when accessing data of greater size than a memory line, for example, a page of memory. Interleaving the memory lines across multiple memory devices allows parallel access to multiple memory lines through parallel access of the respective memory devices.

A contiguous physical address space can also be implemented independently of the underlying configuration of the main memory. In particular, it is possible to ensure a contiguous physical address space even in the case where multiple memory devices have different memory capacities and/or states of individual memory portions. The computer system may use the memory by accessing memory in the form of pages. Each such memory page has to be included in a contiguous physical address space. By using a limited number of contiguous physical address spaces, fewer constraints on the size and number of memory pages are thereby created.

An address layout defines the single unique physical location in a physical main memory of each physical address, also known as the "real address". Herein, the term "physical address" is used to refer to the physical address of a memory line, which implicitly means that the respective physical address refers to the contiguous physical addresses of the bytes or words within the respective line.

A data table structure refers to two-dimensional ordered arrangement of data. It may include, for example, an ordered arrangement of rows and columns. A data table structure can also take the form of a lookup table.

For example, "N" consecutive rows in the first data table structure can be configured allowing simple address interleaving across the rows. The configured consecutive rows may thus enable address interleaving for non-contiguous memory device populations, even in the case of different-sized memory devices. No additional fields in the data table structure are required. Each of the consecutive rows can also describe a memory portion of the uniform size. This can allow a simple address interleaving across the rows capacity.

According to embodiments, each row of the first data table structure includes a memory device identifier. The memory device identifier is used to identify one of the memory devices. Each row can further include a memory portion identifier that identifies one of the memory portions of the respective memory device. Embodiments may be useful for identifying a memory device having the memory line with the respective physical address. According to embodiments, a memory system can rapidly and efficiently identify which memory device to access in order to access the respective device.

According to embodiments, the memory device identifier identifies a memory device that includes two or more memory components. The respective memory line is stored across the memory capacities of the memory components. Thus, the physical address may be mapped on a memory portion included within the set of memory components. For example, the memory device providing the memory portion identified by the row of the first row index can include multiple memory components. Each memory component can have the same memory sub-capacity. Each memory portion of the respective memory device can include an equal share of each of the memory sub-capacities. The memory line is stored across the equal share of the memory sub-capacities that include one of the portions.

Embodiments, so be useful for rapidly and efficiently identifying, based on the information within the memory portion identifier, the memory portion of the memory device, e.g., identified by the memory device identifier of the first data table structure. The relevant memory device may be accessed by a processor chip directly or through a memory hub chip.

According to embodiments, the first index calculation unit can be further configured to calculate, for the physical address, a memory line offset within the memory portion identified by the row of the first row index. Embodiments can be useful for, identifying, based on the calculated offset of the main memory line within the memory portion identified by the memory portion identifier, the precise storage cell comprising the memory line. This identifying can allow the retrieval of data on a fine granular level, e.g., on the level of individual memory lines. According to embodiments, the first index calculation unit can be used for calculating the physical address of a memory line location within the memory device, using the memory line offset of the memory line within the memory portion.

According to embodiments, the first data table structure and the first index calculation unit can be configured so that the memory lines are distributed over the memory portions such that each two memory lines with consecutive physical addresses are stored in memory portions of two different memory devices.

Embodiments can be useful for storing memory lines across multiple memory devices that can enhance access speed by allowing parallel to the respective memory devices. Embodiments can also be useful for allowing enlarged memory portions through the combining of memory portions of a number of memory devices into one common memory structure.

Embodiments can also be useful for allowing memory lines with consecutive physical addresses to be accessed in parallel. In particular, memory pages having consecutive physical addresses can be parallel accessed faster and more efficiently than sequentially access memory pages.

According to embodiments, the first data table structure and the first index calculation unit are configured so that the memory lines are distributed over the memory portions such that memory lines with consecutive physical addresses are "scrambled" or distributed across the memory devices. Embodiments can have the beneficial effect that data may be balanced over the memory devices constituting the main memory. For example, an algorithm may access every "$n^{th}$" memory line. This may lead to individual memory devices being accessed more frequently and thus forming "hotspots". The frequency of access can be counterbalanced by a scrambling or distribution of the physical address space, which can ensure that the memory lines are stored in patterns that avoid creation of hotspots. Address scrambling can also allow for allocating locations within the main memory, i.e., selecting storage cells of within the main memory, in an unpredictable and/or random fashion, thereby scrambling the relationship between physical address and location within the main memory.

According to embodiments, calculating the first row index can include determining a modulo value of the physical address of the memory line. Embodiments may have the beneficial effect that by calculating the first row index based on a modulo value of the physical address, the physical address space can be divided and distributed between the memory portions located on the multiple memory devices. In particular, the physical address space may be divided on a fine granular level, e.g., on level of individual memory lines. Memory lines with consecutive physical addresses can include two different memory portions, which can enable individual memory lines to be accessed in parallel.

According to embodiments, the device for the translating the storage location of the memory line within the main memory to the physical address can also includes a second data table structure. The second data table structure can be configured so that each memory portion is uniquely assigned to a row of the second data table structure. Each row of the second data table structure can be used to identify the physical address of at least one of the memory lines stored in the respective memory portion. The second data table structure can also include a second index calculation unit configured to calculate the location a second row index. The second row index can identify the row of the second data table structure that is assigned to the memory portion comprising the storage location of the memory line.

According to embodiments, the second index calculation unit can be part of the first index calculation unit, i.e., the first row index calculation unit may be configured to calculate the first row index and the second row index. In some embodiments, the first and the second index calculation unit may be operationally independent from each other.

Embodiments may have the beneficial effect that locations within the main memory, e.g., locations within the memory portions, can be translated back to the physical addresses of the data held by the respective locations. For example, a memory controller may identify a memory location(s) having "reduced reliability" and generate a message indicating the reduced reliability. Reduced reliability may result from one or more defective or "stuck" bit locations within a memory chip, dual in-line memory module (DIMM) or other memory device. In order to be able to identify the data that may be affected by the reduced reliability, the computer system may need information about the physical addresses of the memory lines included within the respective memory portion. The corresponding information may result from the second index calculation unit and the second data table structure in a rapid and efficient manner.

According to embodiments, the physical address identified by the row of the second row index is the physical addresses of a memory line stored at the beginning of the memory portion assigned to the respective row. Embodiments may have the beneficial effect that the second data table structure identifies, for each portion that includes stored data, at least one physical address. Using this basic mapping scheme information, the physical addresses of all memory lines stored in all memory portions can be calculated, while the amount of additional data to be stored in the second data table structure can be minimized. According to embodiments, each row of the second data table structure includes the physical address value of the physical address identified by the respective row.

According to embodiments, the second index calculation unit can be further configured to calculate the location the physical address of the memory line. The physical address identified by the row of the calculated second row index is used to calculate the physical address of the memory line. The main memory they be accessed, for example, by a processor chip through a memory hub chip. The processor chip may identify data based on physical addresses, while the memory hub chip may transfer data based on its location within local memory devices. Thus, in order to enable the processor chip exchange information about data with the memory hub chip a translation between physical addresses and locations may be necessary.

According to embodiments, the initially available memory devices are determined. The physical address space is mapped to the main memory within the memory devices available and mapping indices, i.e., identifiers depending on the mapping are entered into the first data table structure according to the mapping. Embodiments may have the beneficial effect that the first data table structure is populated depending on the individual configuration of the main memory, i.e., the memory devices included within the computer system and their individual states and capacities. According to embodiments, the second data table structure may be populated with mapping indices, i.e., identifier values, dependent on the mapping implemented by the first data table structure.

The determination, mapping and/or population of the data table structures may be performed by the address translation device and/or additional devices included within the computer system. For example, an analysis tool, mapping tool and/or data table structure population tool may be used for such purposes. These tools may be implemented in the form of a software or firmware program and stored on a non-volatile program medium with machine executable program code embedded therein. These tools can also be implemented in form of hardware, for example, the form of logic circuits.

According to embodiments, the size of the memory capacity of the smallest one of the memory devices constitutes the size of the memory portions. Embodiments may have the beneficial effect that each memory portion is included within a single memory device.

According to embodiments, the size of the memory capacity of the smallest memory devices can be an integer multiple of the size of the memory portions. Embodiments may have the beneficial effect that each memory device can include a plurality of memory portions. Thus, the physical addresses may be distributed across a number of memory portions and thus memory devices. In particular, it may be possible to implement an address scrambling.

According to embodiments, the physical addresses are mapped to the main memory such that a set of memory lines with consecutive physical addresses is included within a single memory device. The set of memory lines may, for example, include two or more memory lines with consecutive physical addresses. Embodiments may have the beneficial effect that at least one memory device may include a contiguous portion of physical address space.

According to embodiments, the main memory can include an additional spare memory portion that is not identified by one of the rows of the first data table structure. In the case of an indication of reduced reliability of a memory portion of the main memory that is identified by a row of the first data table structure, the data stored in the memory portion of reduced reliability can be moved to the spare memory portion. The row that identifies the memory portion having reduced reliability is reconfigured to identify the spare memory portion to which the data has been moved.

Embodiments may have the beneficial effect that the device may allow for a dynamic memory migration. In the case of indication of reduced reliability for a memory portion, a multitude of memory portions or an entire memory device, data of the respective memory portions having reduced reliability can be moved to other memory portions and/or memory devices having no reliability issues. Thus, memory failures and in particular data losses can be prevented.

According to embodiments, in the case of an indication of reduced reliability of a communication connection to a memory device, all rows of the first data table structure that identify a memory portion located within the respective memory device can be removed from the first data table structure. Embodiments may have the beneficial effect that by removing rows from the first data table structure identifying locations of the main memory with reduced reliability, the usage of such portions of the main memory may be avoided. In other words, the respective locations of the main memory with reduced reliability may be filtered out and excluded from further usage. Thus, possible failures and/or data losses due to the lack of reliability of the respective portions of the main memory may be efficiently avoided.

According to embodiments, in the case of an indication of reduced communication capacity of a communication connection to a memory device, a number of rows of the first data table structure that identifies memory portions located within the respective memory device can be removed from the first data table structure. The number can be proportional to the degree of reduction of the communication capacity.

Embodiments may have the beneficial effect that in the case of reduced bandwidth of a communication connection, for example due to a malfunction of at least one wire of a plurality of wires implementing the respective communication connection, the respective reduction may be compensated by the number of rows being reduced proportionally to the degree of reduction of the communication capacity. In other words, the extent of memory portions located within the respective memory device that are used for memory storage can be reduced proportionally to the degree of reduction of the communication capacity. Thus, the reduction of bandwidth can be compensated due to the reduced amount of data stored on the respective memory device resulting in a statistical reduction of data accesses on the respective memory device.

According to embodiments, the computer system can include multiple processors. The memory devices can include multiple sets of memory devices. Each set of memory devices includes at least one memory device. Each processor can be uniquely assigned to one of the sets of memory devices. The address translation device can be one of a plurality of address translation devices for translating physical addresses to locations within the main memory. Each address translation device can include a first index calculation unit and a first data table structure. Each processor can include one of the address translation devices. Some embodiments can have the beneficial effect that in the case of multiple processors, multiple address translation devices may be used, which can enable a rapid and efficient translation of physical addresses to locations of memory portions in order to enable accessing data stored within the respective memory portions.

An address translation device can include a multitude of first data table structures, each of the respective first data table structures configured with a different set of portions.

According to some embodiments, the first data table structures of the address translation devices can be identical. At least one of the address translation devices can include a supplement data table structure used for translating additional physical addresses to additional locations within the main memory. Embodiments can have the beneficial effect that restricting the supplement data table structure to a limited number of processors, for example one processor, the security can be improved. Only the processor having an address translation device with the supplement data table structure may be able to access data with physical addresses translated by the respective supplement data table structure. Other processors lacking the supplement data table structure may not be able to translate physical addresses of the respective data to locations of memory portions. Therefore, other processors may not be able to access the respective data in the main memory. Thus, a set of data or memory lines may be defined to which each processor has access rights, i.e., each processor includes a first data table structure with an identifier identifying the location of the main memory holding the respective data. In addition, a set of data or memory lines may be defined to which only a limited number of processors has access rights.

According to embodiments, the first data table structure of each processor can be configured for translating physical addresses to locations within the memory devices to which the respective processor is assigned. Each physical address can be assigned with a processor identifier identifying one of the processors. Embodiments may have the beneficial effect that each processor with an individual main memory defined by the memory device is connected with the respective processor.

The method for translating a physical address of a memory line to a location within a memory device of a main memory of a computer system that holds the memory line may be suitable for operating each of the embodiments of the address translation device described herein. A computer program product comprising a computer-readable non-volatile storage medium having computer-readable program code embodied therewith may include firmware implementing the respective method.

For example, a number "R" of consecutive rows may be configured in the first data table structure to describe the capacity number of memory line locations of the physical memory devices of a computer system. Each row may identify a unique contiguous portion of the capacity of one of the memory devices and each memory line can be a member of at most one portion. In other words, partitions do not overlap. Across the rows, the portions may each have the same capacity that includes a number "P" of memory lines. The first data table structure may be configured, for example, at boot time or when memory devices fail or their usage changes. The configured first data table structure may be needed for later memory access to the individual memory lines.

A contiguous physical address space of a computer system, having a capacity of "S" memory lines in the space that equals R multiplied by P, may have the interleaved address layout over the memory devices given by striping the addresses across the rows of the first data table structure. In a typical striping, consecutive physical addresses can be located on different rows.

Each physical address may be uniquely identified by an integer value in the range between 0 and (S−1) and each row may be uniquely identified by an integer value in the range between 0 and (R−1). For each access of a physical address, the calculation, i.e., physical address value modulo R, can identify the row having entries that identify the memory device and memory portion to be accessed for the physical address. Each line in a portion may be uniquely identified by an integer value in a range between 0 and (P−1). For each access of a physical address, the calculation, i.e., physical address value divided by R, can identify the line in the memory portion to be accessed for the physical address. In this way the physical address can be converted to a location within one of the memory portion of one of the memory devices providing the main memory, for example, in order to load/read or store/write data.

The memory portion capacity of P memory lines may be configured such that for a small integer number of memory portions, where the number of memory portion may differ across the memory devices, i.e., a relatively small number of configured rows, each of all or most memory lines of each memory device is a member of a partition. For example, given three memory devices with sizes 6 million, 9 million, and 12 million memory lines, a partition size of 3 million memory lines may be used. In other words, each memory portion may include 3 million memory lines.

The value "maxPortions" can represent the maximum number of portions in any memory device such that each memory portion in a memory device is uniquely identified by the memory portion identifier "portionIndex", which can be an integer in a range between 0 and (maxPortions−1). The memory lines' locations within a memory device can be unique integers greater than 0. The memory portions within a memory device may be contiguous. The line location 0 of the device may be a member of the first memory portion, so that for any memory line in the memory device its portionIndex is calculated as its memory device location divided by P.

The value "numDevices" may be the number of memory devices included within the main memory arrangement, such that each memory device is uniquely identified by the memory device identifier "deviceIndex", an integer having a value between 0 and (numDevices−1). R rows may be configured in a second data table structure. One row of the second data table structure can be configured for each configured row, i.e., identified memory portion, of the first data table structure. Given a memory line's location within a memory device and its deviceIndex, the index of the row in the second data table structure may be calculated as the integer value:

deviceIndex*maxPortions+portionIndex.

The configured field of the respective row of the second data table structure may be the value of the first physical address of that partition.

In a scenario providing a memory line's location within a memory device and its deviceIndex, the physical address of the respective memory line may be calculated as follows:

((location modulo P)*R)+(the first physical address
of the corresponding partition looked up in the
corresponding row of the second data table
structure)

In response to a memory access request, the memory system can identify the correct reply with the line's location within of one of the memory device and its deviceIndex, which the requestor may use to calculate the physical address of the reply.

FIG. 1 depicts a general computing system 100 suited for implementing embodiments of the present disclosure. The general system 100 may be, for example, implemented in form of a server, an embedded computerized system or general-purpose digital computer, such as a personal computer, workstation, minicomputer, or mainframe computer. The most general system 100 therefore includes a general-purpose computer 101.

The computer 101 may in particular be configured as a server, i.e., being optimized for a high-speed data exchange with a large number of clients. The computer 101 may further possess a large processing, i.e., central processing unit (CPU) capacity and/or large main memory capacity. The software in memory 110 can also include a server software application for processing a large number of requests by clients.

In some embodiments, as depicted in FIG. 1, the computer 101 can include a processor 105, main memory 110 coupled to a memory controller 115, and at least one input and/or output (I/O) device or peripheral 10 and 145 that are communicatively coupled through a local input/output controller 135. The input/output controller 135 can include, but is not limited to, at least one bus or other wired or wireless connections. The input/output controller 135 can have additional elements, omitted for simplicity, such as controllers, buffers/caches, drivers, repeaters, and receivers, to enable communications. The local interface can also include address, control, and/or data connections to enable appropriate communications among the described components. As described herein, the I/O devices may generally include any generalized portable storage medium 10, such as a Universal Serial Bus (USB) flash drive, or a database 145.

The processor 105 can be a hardware device for executing software that is stored in memory 110. The processor 105 can be any custom or commercially available processor, a CPU, an auxiliary processor among several processors associated with the computer 101, a semiconductor-based microprocessor, e.g., a microchip or chipset, a microprocessor, or generally any device configured to execute software instructions. The processor 105, also referred to as "processor chip", can include an address translation device operable for translating physical addresses of a memory line to a location within a memory device of main memory 110. Thus, the processor 105 may be enabled to access memory lines stored in the main memory 110 in a rapid and efficient way.

Methods described herein may, for example, be implemented in software, including firmware, hardware/processor 105, or a combination thereof.

The memory 110, also referred to as "main memory", can include any one or combination of volatile memory devices, e.g., random access memory (RAM, such as dynamic random-access memory (DRAM), static random-access memory (SRAM), synchronous dynamic random-access memory (SDRAM), etc.) and nonvolatile memory devices, e.g., read-only memory (ROM), erasable programmable read only memory (EPROM), electrically erasable programmable read only memory (EEPROM), or programmable read-only memory (PROM). The memory 110 may have a distributed architecture, where additional modules are situated remotely from one another, but can be accessed by the processor 105. In particular, the main memory 110 may include multiple memory devices, each of which may include a memory capacity, i.e., memory space, including at least one memory portion. A memory portion may include at least one physical storage cell.

The memory 110 can include software that includes computer-readable software instructions 112. The software in memory 110 may further include a suitable operating system (OS) 111. The OS 111 can be used to control the execution of other computer programs, such as possibly software 112.

In some embodiments, a keyboard 150 and mouse 155 can be coupled to the input/output controller 135. Other output devices such as the I/O devices 145 may include input devices including, but not limited to, a printer, a scanner, microphone, and the like. The I/O devices 10, 145 may also include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The I/O devices 10, 145 can be any generalized cryptographic card or smart-card known in the art. In some embodiments, the system 100 can also include a display controller 125 coupled to a display 130. In some embodiments, the system 100 can also include a network interface for coupling to a network 165. The network 165 can be an Internet protocol (IP) based network configured for communication between the computer 101 and any external server, client through a broadband connection. The network 165 can transmit and receive data between the computer 101 and external systems 30, which can be involved to perform part or all of the operations of the methods discussed herein. In some embodiments, network 165 can be a managed 'IP network administered by a service provider. The network 165 may be implemented in a wireless fashion, e.g., using wireless protocols and technologies, such as wireless fidelity (Wi-Fi), Worldwide Interoperability for Microwave Access (WiMAX), etc. The network 165 can also be a packet-switched network such as a local area network, wide area network, metropolitan area network, Internet network, or other similar type of network environment. The network 165 may be a fixed wireless network, a wireless local area network (LAN), a wireless wide area network (WAN) a personal area network (PAN), a virtual private network (VPN), intranet or other suitable network system and includes equipment for receiving and transmitting signals.

If the computer 101 is a personal computer (PC), workstation, intelligent device or the like, the software in the memory 110 may further include a basic input output system (BIOS) 122. The BIOS is a set of essential software routines that initialize and test hardware at startup, start the OS 111, and support the transfer of data among the hardware devices. The BIOS can be stored in ROM so that the BIOS can be executed when the computer 101 is activated.

When the computer 101 is in operation, the processor 105 is configured for executing software 112 stored within the memory 110, to communicate data to and from the memory 110, and to generally control operations of the computer 101 according to the software. The methods described herein and the OS 111, in whole or in part, but generally the latter, are read by the processor 105, possibly buffered within the processor 105, and then executed.

Software 127 can be stored on any computer-readable medium, such as storage 120, for use by, or in connection with, any computer-related system or method. The storage 120 may include a disk storage unit such as hard disk drive (HDD) storage device.

Figure 2A:
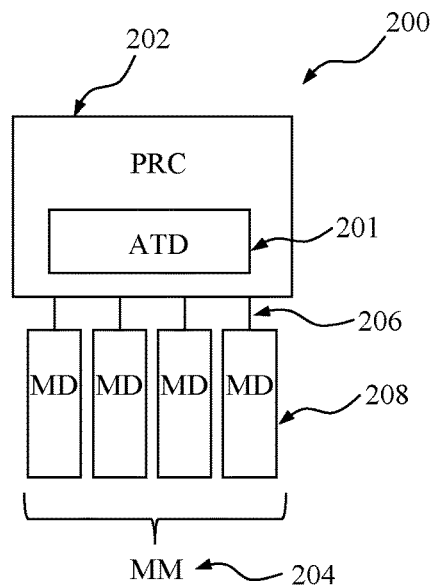
FIG. 2A is a schematic diagram illustrating a single processor architecture suited for implementing embodiments of the present disclosure.

FIG. 2A depicts a single processor architecture in the form of a single processor computer system, for example, a single processor server 200 suited for implementing embodiments of the present disclosure. Single processor server 200 includes a processor chip 202 and a main memory 204 with a plurality of memory devices 208. The processor chip 202 is connected through communication connections 206 with the plurality of memory devices 208. The memory devices 208 constitute the main memory 204. The processor chip 202 can also include an address translation device (ATD) 201 configured for translating physical addresses to locations included within the main memory 204, i.e., at least one of the memory devices 208.

Figure 2B:
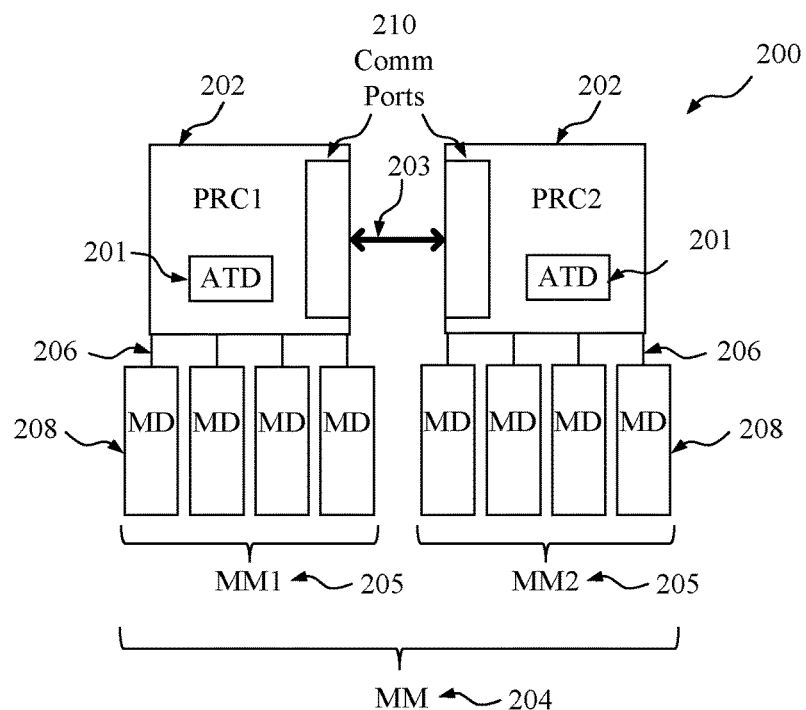
FIG. 2B is a schematic diagram illustrating a non-uniform memory access (NUMA) multi-processor architecture suited for implementing embodiments of the present disclosure.

FIG. 2B depicts a NUMA multi-processor architecture including two processor chips 202. The architecture depicted is a multi-processor computer system, for example, a multi-processor server 200 including multiple processors 202. The main memory 204 includes multiple parts 205 each including multiple memory devices 208. Each part 205 of main memory 204 is assigned to one of the processor chips 202 and is only accessible through the respective assigned processor chips 202. Each of the memory devices 208 is connected through a communication connection 206 to one of the multiple processor chips 202. The processor chips 202 are interconnected to each other through a communication connection 203, for example, a point-to-point communication connection. For this purpose, each of the processors 202 includes at least one communication port 210. The communication connection 203 establishes a non-uniform memory access (NUMA) link. In other words, each of the processor chips may be configured for directly access only those memory devices 208 that are connected with the respective processor chip 202 through a direct communication connection 206. Access to the other memory devices 208 included within an additional part 205 of the main memory 204 is only possible through an additional processor chip 202 directly connected with the respective memory devices 208 of the additional part 205 of the main memory 204. Servers having various numbers of processor chips 202 and various numbers of memory devices 208 may be implemented using such a NUMA configuration. A contiguous and/or interleaved memory layout, i.e., data striping, can also be supported. Data striping refers to a technique of segmenting logically sequential data, such that consecutive segments are stored on physically different memory devices. Striping is useful, for example, when a processing device, such as a processor, requests data more rapidly than a single memory device can supply it. By spreading segments of the data across multiple memory devices that can be accessed concurrently, the total data throughput can subsequently be increased. In the case of a contiguous memory layout, the entire main memory 205 behind a single processor chip 202 may constitute a single contiguous physical address range. In the case of an interleaved memory layout, on level of a selected granularity, e.g., cache line or memory page, physical memory addresses may be distributed over locations within different memory devices 208 using e.g., round-robin.

Figure 2C:
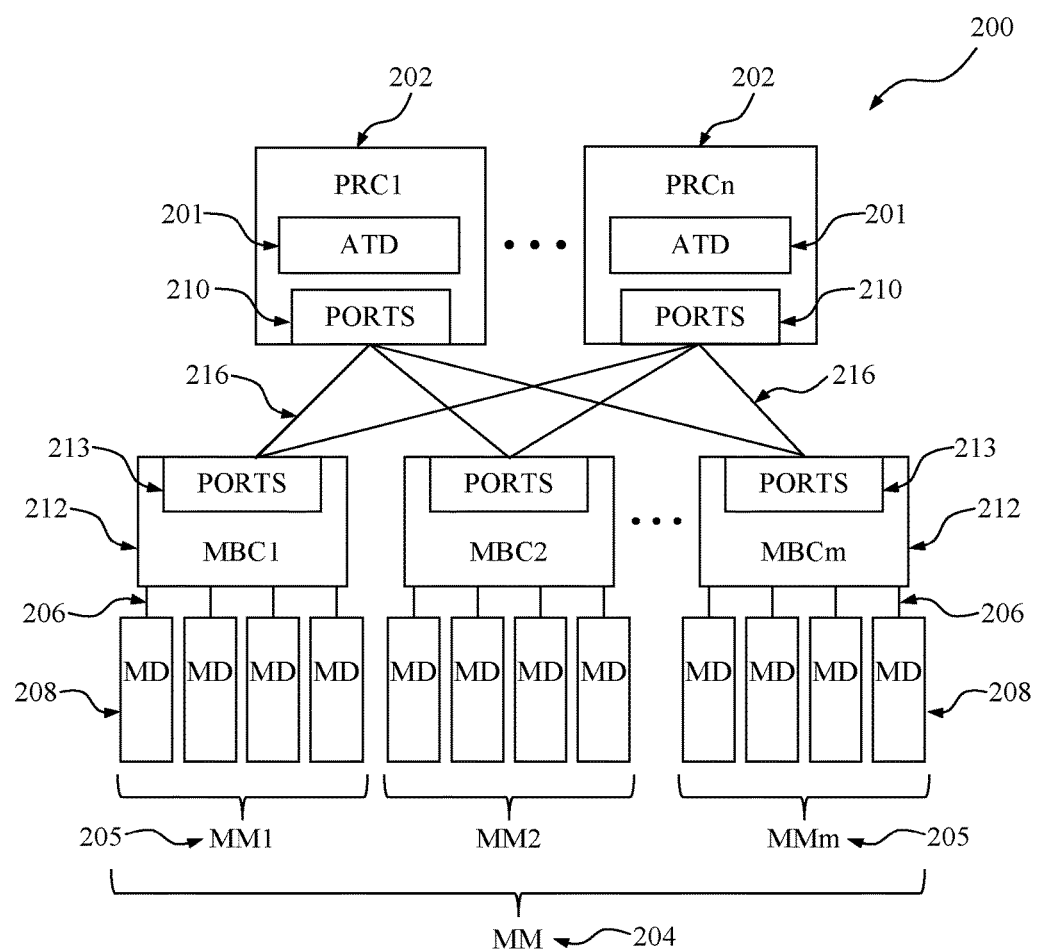
FIG. 2C is a schematic diagram illustrating a multiprocessor architecture suited for implementing embodiments of the present disclosure.

FIG. 2C depicts a multi-processor architecture in form of a multi-processor computer system, e.g., a multi-processor server 200 comprising multiple processor chips 202. Each processor chip 202 is connected through ports 210 with each memory buffer chip 212 of a number of memory buffer chips, also referred to as hub chips, through ports 213. Each of the memory buffer chips 212 is connected with a plurality of memory devices 208 through communication connections 206. The entirety of the memory devices 208 constitutes the main memory 204 of the multiple processor server 200. The memory devices 208 are thus arranged in groups or sets. Each group is interconnected with a single memory buffer chip 212 to which they are assigned. The memory devices 208 of each group are only accessible through the respective memory buffer chips 212 to which they are assigned and form a subset 205 of the main memory 204. Each of the processor chips 202 can also include an address translation device 201 in order to enable access to data stored within the memory devices 208 by the processor chip 202 using physical addresses that are translated to locations within the memory devices 208.

Figure 3:
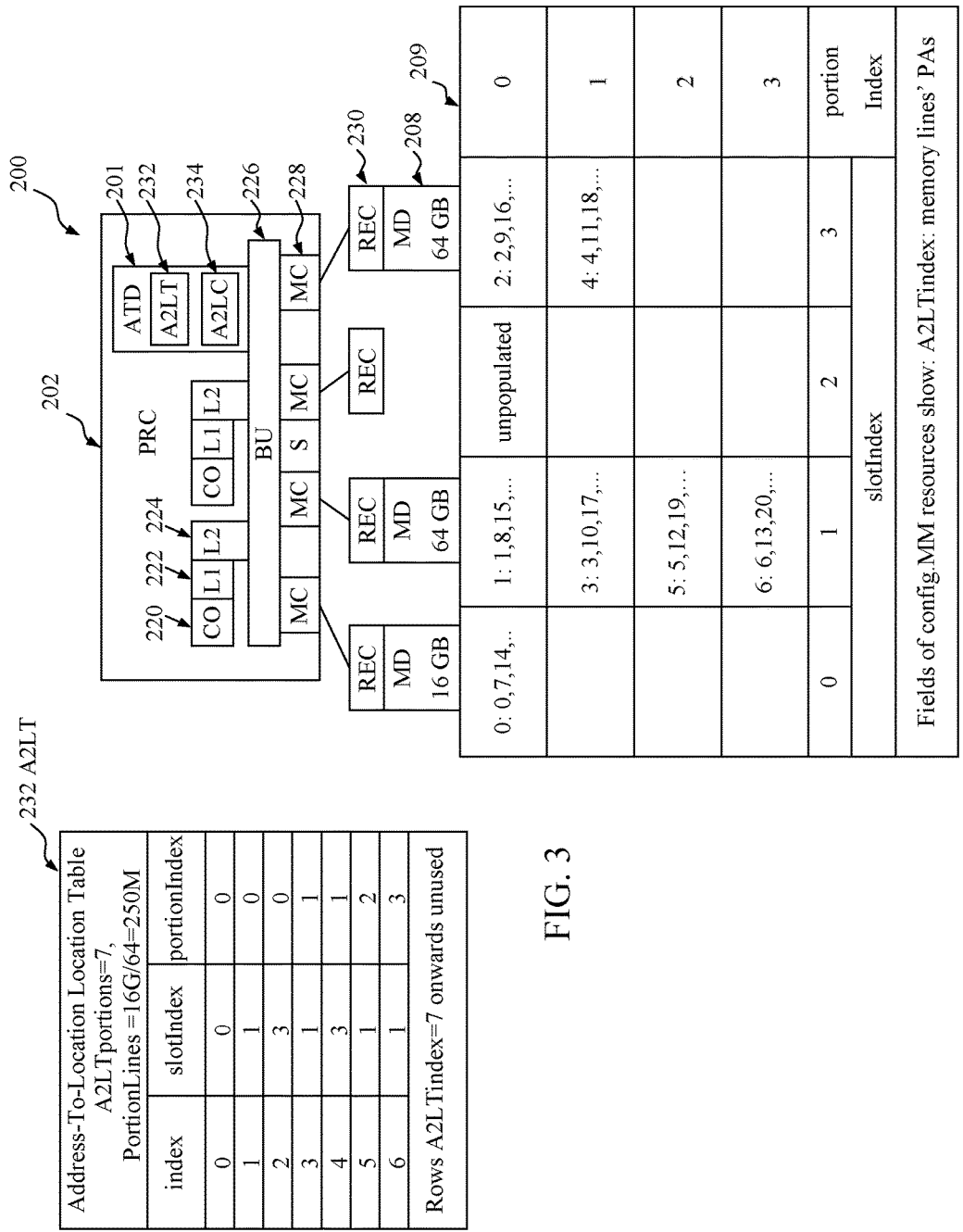
FIG. 3 is a schematic diagram illustrating a first data table structure and main memory configuration, according to embodiments consistent with the figures.

FIG. 3 depicts a main memory layout. For the example addresses "0, 7, 14" and so on, the location in physical memory is depicted. This main memory layout may, for example, be implemented in a server architecture according to FIG. 2A or 2B. Each of the processor chips 202 includes multiple cores 220, each core 220 having caches 222, 224 of different levels, for example, "level 1" and "level 2". The cores 220 of the processor chip 202 can access memory devices 208 through a data bus 226 and memory control devices 228. The processor chip 202 can also include multiple receptacles 230 configured for implementing a communication connection between the connected processor chip 202 and multiple memory devices 208. Each receptacle 230 may, for example, be configured to receive a memory device 208. In the example depicted, only a subset of the available receptacles 230 includes a memory device, i.e., only three of four receptacles 230 include a memory device 208. Various memory devices 208 can have different memory capacities. One of the memory devices 208 depicted has a memory capacity of 16 GB, while the other memory devices 208 have capacities of 64 GB.

The processor chip 202 also includes an address translation device (ATD) 201 with an address-to-location data table structure (A2LT) 232 and an index calculation unit (A2LC) 234. The structure of the main memory capacity of the memory devices 208 is illustrated by the table 209 depicted beneath memory devices 208. The memory lines are stored in an interleaved, distributed arrangement, across the memory portions of the memory devices 208. The structure of the A2LT 232 is depicted in detail. A row of the A2LT is identified and randomly accessed using its row index "index." Each row of the A2LT includes multiple entries. The entries include a pair of identifiers "slotIndex" and "portionIndex." The memory device identifier slotIndex identifies one of the receptacles 230 and thus one of the memory devices 208. The memory portion identifier portionIndex identifies an individual memory portion of the memory devices 208 indicated by the memory device identifier. The capacities of all the memory devices 208 connected to one of the receptacles 230 can be examined when the system is booting. Based on the examination, the main memory capacity of the memory devices 208 can be divided into at least one main memory portion of uniform size. Each portion of the main memory may form a memory portion. For example, in the case of the embodiment depicted in FIG. 4, the size of one portion is equal to the size of the memory capacity of the smallest memory device 208, i.e., 16 GB. The size of the portions may be specified by the number of memory lines storable in the respective portion. In the case of memory lines of a size of 64 GB and a proportion size of 16 GB, the number of memory lines per main memory portion, i.e., "PortionLines" is 250 million.

In the example depicted in FIG. 3, the main memory 204 of the memory devices 208 may be divided into seven memory portions. The A2LT 232 includes seven rows in a range between 0 to (number of portions−1), each row assigned to a unique portion of the main memory 204. In the case of a multi-processor chip server, e.g., all processor chips can include the same A2LT configuration.

Figure 4:
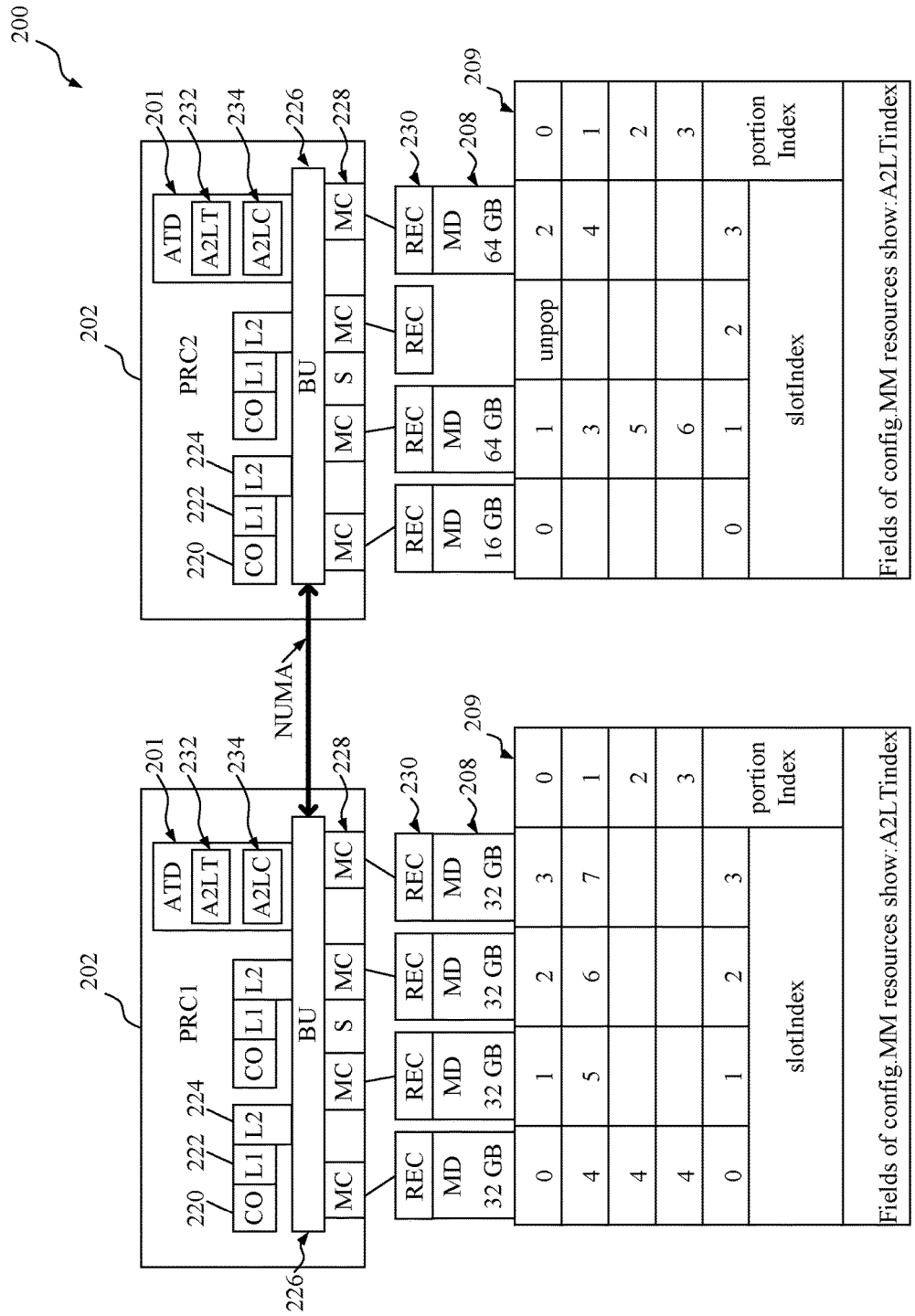
FIG. 4 is a schematic diagram illustrating a mapping between physical addresses and memory locations, according to embodiments consistent with the figures.

In order to translate a physical address to a location within the main memory, i.e., a location within an individual memory portion, the following algorithm may be executed by the ATD 201:
 1. PA_ALTindex=PA mod ALTportions
 2. PA_slotIndex=ALT [PA_ALTindex].slotIndex
 3. PA_offset=floor(PA/ALTportions)
 4. PA_portionIndex=ALT[PA_ALTindex].portionIndex
 5. PA_slotLine=PA_portionIndex*PortionLines+PA_offset In addition to A2LT 232, the value PortionLines can be used to define the number of memory lines per main memory portion is and the value "ALTportions" can be used to define the number of portions included within A2LT 232. In operation 1, for a given physical address "PA" a corresponding first row index "PA_ALTindex" of the A2LT 232 assigned to the physical address PA can be calculated using a modulo value based on the number of portions ALTportions included within A2LT 232. The respective first row index PA_ALTindex corresponds to an individual row of the A2LT. PA_ALTindex is used for determining the slotIndex of the respective PA "PA_slotIndex" and the portionIndex of the respective PA "PA_portionIndex" as depicted in operations 2 and 4. An offset of the location to be identified can also be calculated in operation 3. In operation 5, an individual memory line "PA_slotLine" of the main memory stored in the memory device identified by PA_slotIndex, i.e., operationally connected with the receptacle identified by PA_slotIndex, and assigned with PA is identified. In other words, PA_slotLine identifies the number of the memory line assigned with PA in the memory capacity of the memory device identified by PA_slotIndex. Using the modulo value for computing PA_ALTindex, it may be ensured that memory lines with consecutive physical addresses are included within two different portions of the main memory, i.e., two different memory portions. For example, as indicated by table 209, portion 0 includes PAs 0, 7, 14, while portion 1 includes PAs 1, 8, 15 etc. six When the first data table structure implements a mapping of the physical address space to locations within the main memory such that a contiguous part of the physical address space is mapped to a contiguous portion of the main memory, for example the following algorithm may be executed for translating a physical address to a location within a main memory:
 1. PA_ALTindex=floor(PA/ALTportions)
 2. PA_slotIndex=ALT [PA_ALTindex].slotIndex
 3. PA_offset=floor(PA/ALTportions)
 4. PA_portionIndex=ALT[PA_ALTindex].portionIndex
 5. PA_slotLine=PA_portionIndex*PortionLines+PA_offset FIG. 4 depicts a main memory layout. For each portion of a populated memory device, the "A2LTindex" is depicted, which also corresponds to the address of the first location in that portion. This main memory layout may, for example, be implemented in a multi-processor server architecture according to FIG. 2B. The multi-processor server 200 depicted in FIG. 4 includes two processor chips 202. Each of the processor chips 202 is connected with an individual set of memory devices 208. The physical address of a memory line may be assigned with a bit field identifying the processor chip 202 with a receptacle 230 that is connected with the memory device 208 comprising the location identified by the physical address. For example, a binary number can be used, where one of the bits of the binary number identifies the processor chip 202, while the remaining bits correspond to and denote the physical address identifying the location within the memory portion of the respective processor chip 202. Each of the processor chips 202 includes an ATD 201 comprising an A2LT 232 and an A2LC 234. According to embodiments, the A2LT 232 may only include translations of physical addresses that are assigned to locations of the local memory portions of the respective processor chip 202. According to some embodiments, different processor chips 202 may for example have different ATD configurations with, for example, different A2LTs 232. For example, the entire main memory behind a processor chip 202 may have a single contiguous physical address range. The structure of the main memory capacity of the memory devices 208 is illustrated by the tables 209 depicted beneath memory devices 208. The tables 209 show the distribution of the memory portions across the main memory. To each of the portions a row of an A2LT 232 is assigned.

Figure 5:
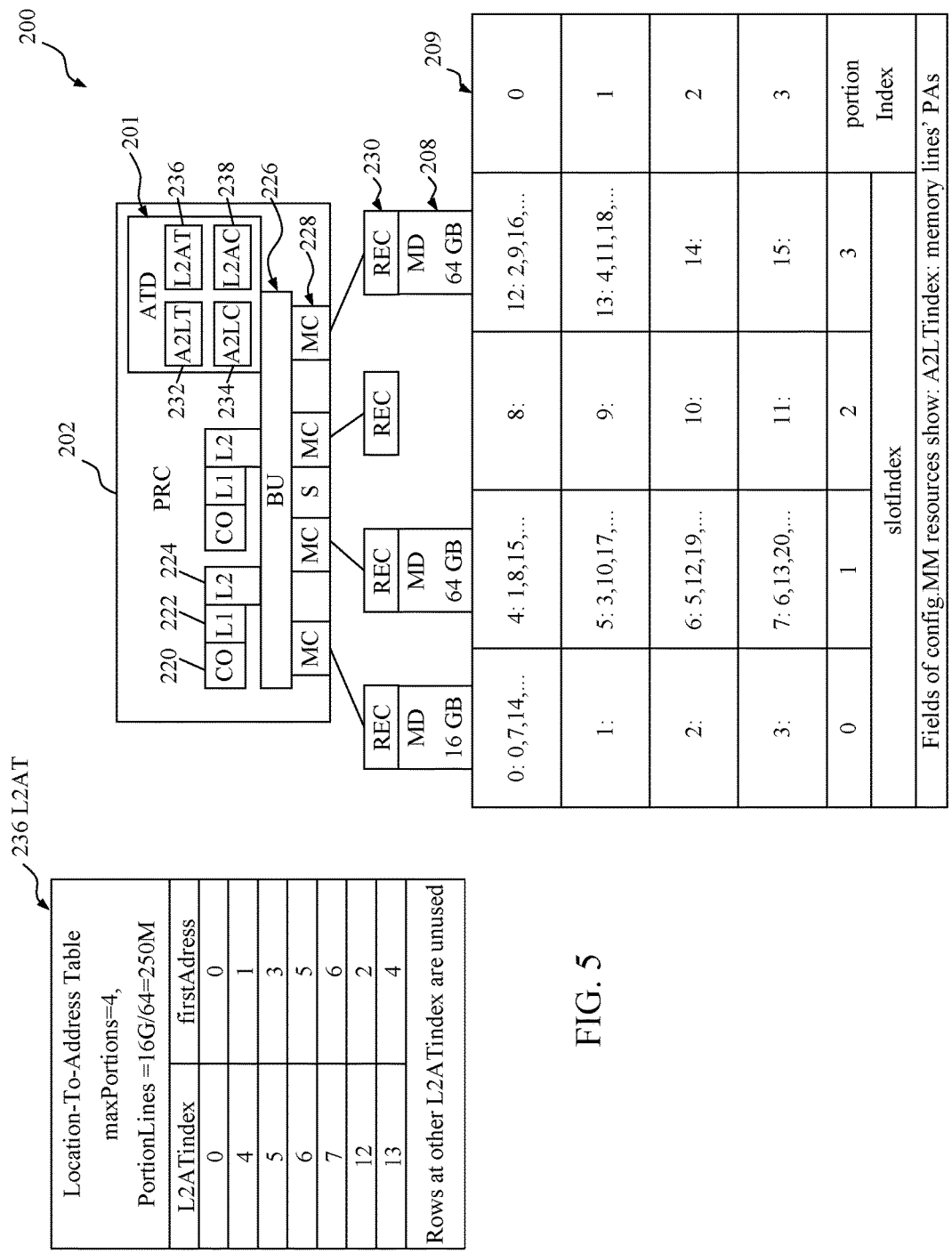
FIG. 5 is a schematic diagram illustrating a second data table structure and main memory configuration, according to embodiments consistent with the figures.

FIG. 5 depicts the main memory layout according to FIG. 3. The ATD 201 of the processor chip 202 includes an additional location-to-address data table structure (L2AT) 236 and an index calculation unit (L2AC) 238 configured to calculate a row index of the L2AT 236 from the location within the main memory 204. The L2AC uses L2AT entries to calculate the physical address corresponding to the memory line location.

In the embodiment depicted in FIG. 5 the access by a processor core 220 to a memory line at a given physical address may miss in the L1 cache 222 and may miss in the L2 cache 224 and thus result in the L2 cache 224 issuing a request on the bus 226 for the memory line. In the request, the memory line is identified by the physical address of the memory line. Upon the request arriving at the ATD 201, the configured A2LC unit 234 calculates the appropriate row to be read from the configured A2LT table 236. The A2LC unit 234 uses the row's entry to calculate the memory location corresponding to the given physical address. The ATD 201 then reissues the request on the bus 226 for the memory line, with the request identified by the line's memory device 208 and the calculated line's location within the memory device. The reissued request is received by the memory controller 228 corresponding to the identified memory device 208. The memory controller accesses the memory line at the identified location within the memory device and then issues a reply on the bus 226, with the reply identified by the line's device 208 and the line's location within the device. Upon the reply arriving at the ATD 201, the configured L2AC unit 238 calculates the appropriate row to be read from the configured L2AT table 236 to calculate the physical address corresponding to the identified location of the memory line. The ATD 201 then reissues the reply on the bus 226 for the memory line, with the reply identified by the line's physical address. The reissued reply is received by the L2 cache 224 that issued the original request.

Each of the memory portions within the memory devices 208 is assigned to a row of the L2AT 236. A row of the L2AT is identified and randomly accessed using its row index "L2ATindex." At boot time for example, for each memory portions the physical address identifier, e.g., the physical address value "firstAddress" is entered in the L2AT 236. This can for example be performed by firmware or hardware. The firstAddress identifies the physical address of the first memory line stored in the respective memory portion. Some embodiments include a mapping between the physical addresses and the locations that identifies for each of the memory portions the physical address of the first memory line stored therein. In order to translate a location to an address, the following algorithm may be executed:

1. PA_portionIndex=floor(slotLine/PortionLines)
2. PA_L2ATindex=slotIndex*maxPortions+PA_portionIndex
3. PA_firstAddress=L2AT[PA_L2ATindex].firstAddress
4. PA_offset=PA_slotLine mod PortionLines*LATportions
5. PA=PA_firstAddress+PA_offset As depicted in FIG. 5, each memory device is assigned with the same number of memory portions independent of the number of memory portions actually included within the respective memory device. In addition to L2AT 236, the value maxPortions can also be used to define the maximum number of main memory portions, i.e., memory portions, in any of the memory devices. The value PortionLines can also be used to define the number of memory lines per main memory portion. A pair of identifier (slotLine, slotIndex) identifies, for a given memory line a location within one of the memory devices, and more precisely the number of the memory line in the memory capacity included within the memory device identified by slotIndex. In operation 1, the identifier PA_portionIndex of the main memory portion is calculated including the memory line for which the PA is to be determined. In operation 2, the row index "PA_L2ATindex" of the row of L2AT 236 assigned to the identifier pair (slotLine, slotIndex) is calculated. In operation 3, the physical address "PA_firstAddress" of the first memory line included within the main memory portion is determined that also includes the memory line for which the PA is to be determined. PA_firstAddress may be determined using the L2AT 236 and the row index PA_L2ATindex identifies a row comprising PA_firstAddress. In operation 4, an offset "PA_offset" of the physical address to be determined relative to the PA_firstAddress identified in operation 3 is calculated. The calculation of PA_offset may vary depending on the mapping of the main memory capacity to the physical address space. In operation 5, PA is determined using PA_firstAddress and PA_offset.

Figure 6:
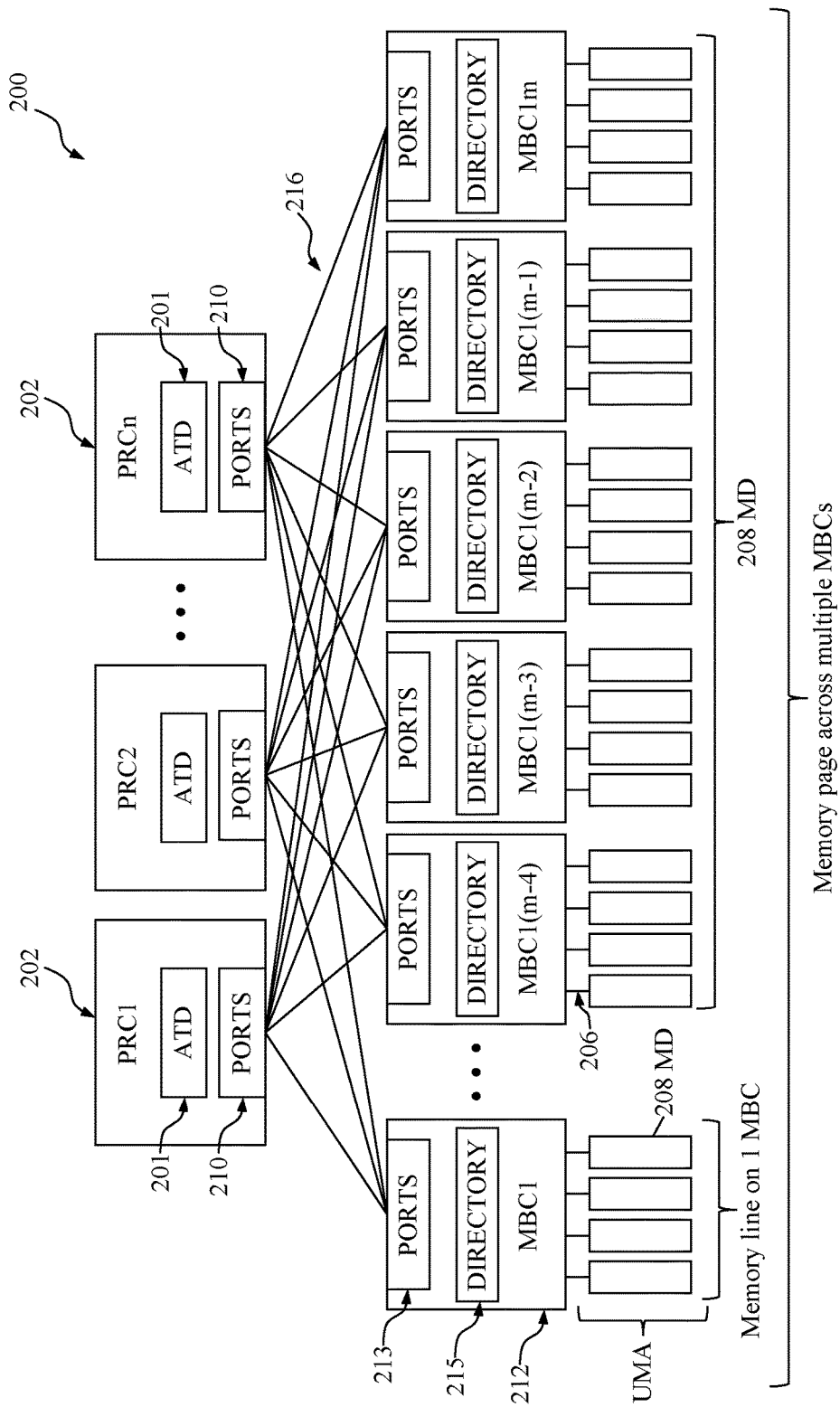
FIG. 6 is a schematic diagram illustrating details of the architecture depicted FIG. 2C, according to embodiments consistent with the figures.

FIG. 6 depicts, in more detail, the multi-processor architecture of FIG. 2C in the form of a multi-processor computer system, for example, a multi-processor server 200 comprising multiple processor chips 202. The multi-processor server 200 includes a plurality of processor chips 202, and can also include a set of memory buffer chips 212. Each processor chip 202 may include an address translation device 201, and can also include a plurality of ports 210. According to an embodiment the number of ports 210 per processor chip 202 may be equal to the number of memory buffer chips 212. Each processor chip 202 may, for example, include a cache for caching memory lines to be processed by the processor chip 202. For the set of processor chips 202 of the server 200, the processor chips 202 may or may not be identical. Application software may be executed on at least one processor chip 202 and thus a given application may implicitly or explicitly exploit and benefit from similar or different processor chips 202.

Each memory buffer chip 212 may include a plurality of local memory devices 208, for example, DIMMs including a number of dynamic random-access memory ICs. Each memory buffer chip 212 can also include a plurality of ports 213. For example, the number of ports 213 per memory buffer chip 212 may be equal to the number of processor chips 202. In addition, each memory buffer chip 212 may include a coherence directory 215 for implementing directory-based coherence for memory lines stored in the memory devices 208 local to the respective memory buffer chip 212. For the set of memory buffer chips 212 of the server 200, all the memory buffer chips 212 can be the same or similar with each memory buffer chip 212 performing similar functions. Application software may be executed on at least one processor chip 202 and thus performance of a given application generally benefits from memory being served by many and similar memory buffer chips 212, with each particular memory address being served by a single predefined memory buffer chip 212.

Each processor chip 202 may be communicatively coupled with each memory buffer chip 212, for example, through a bidirectional point-to-point communication connection 216. Such coupling can include, for example a serial communication connection. Thus, each processor chip 202 may include memory access to each of the memory devices 208 local to one of the memory buffer chips 212. The access to the memory devices 208 can be based on a uniform memory access (UMA) architecture. A given memory line, i.e., cache line, may be stored at least one memory device 208 local to the same memory buffer chips 212. A given memory page comprising a plurality of memory lines can, for example, be scrambled or distributed across the memory devices 208 of all memory buffer chips 212.

The computer system may include, for example, 16 processor chips 202 and 128 memory buffer chips 212. In this case, each processor chip 212 can include 128 ports 210 in order to be communicatively coupled to each of the memory buffer chips 212. In embodiments, each of the memory buffer chips 202 may also include 16 ports 213 such that each memory buffer chip 212 can be communicatively coupled to each processor chip 202 through a distinct point-to-point communication connection 216.

An A2LT can, for example, include 8192 rows. Assuming the largest server of a computer system includes 512 memory devices, the L2AT with 8192 rows allows 16 memory portions for the largest memory device, in the case of a server mainly populated by memory devices of the largest type. So, the largest type memory devices may have 16× capacity of the smallest memory devices. For example, the smallest memory devices may include memory devices such as DIMMs with a capacity of 16 GB, while the largest memory devices may include memory devices like DIMMs with a capacity of 256 GB. 512 memory devices require a memory device identifier that includes 9 bits. Assuming that the smallest server includes 8 receptacles for memory devices, each receptacle can receive a memory device comprising 1024 memory portions. Therefore, the memory portion identifier may require 10 bits. The larger the number of portions, the finer the resulting granularity. This may allow the mapping of relatively small portions of the main memory in the case the main memory is experiencing reduced reliability. This may result in a requirement of:

(8192 entries)*(9+10)bits+ECC=19456 *B*+ECC for the *A2LT*

A level 2 cache can generally have a capacity of approximately one MB. Level 2 cache access time is generally sufficient for A2LT. Considering a corresponding L2AT with 8192 rows, the first address value is 0 to 8191 requiring 13 bits per entry, which is less than an A2LT entry.

Figure 7:
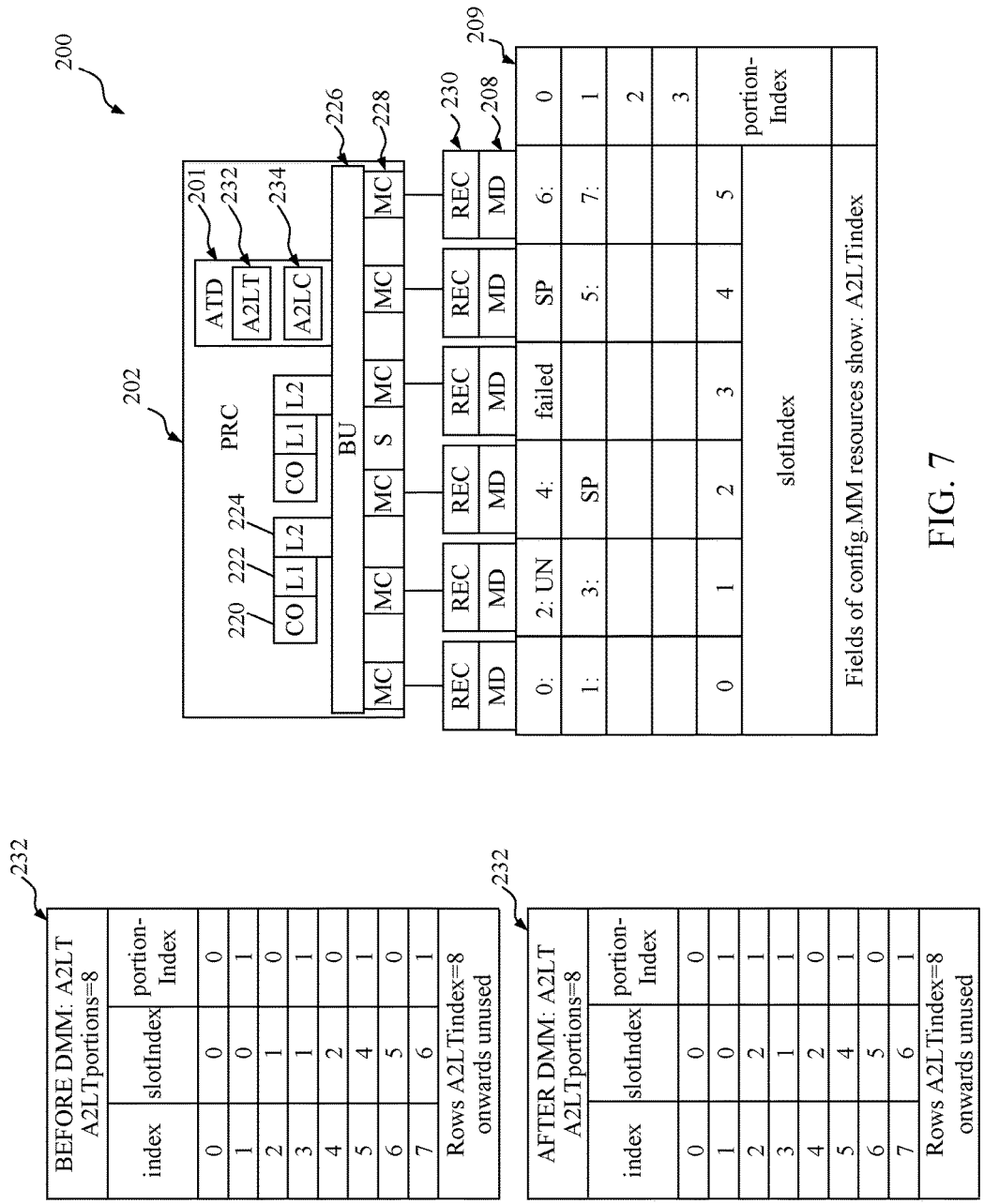
FIG. 7 is a schematic diagram illustrating a mapping between physical addresses and memory locations, according to embodiments consistent with the figures.

FIG. 7 depicts a layout of a main memory comprising spare memory portions "SP" in order to perform a dynamic memory migration in the case it is necessary. For each portion of a populated memory device, the A2LTindex is depicted, which also corresponds to the address of the first location in that portion. A2LT 232 can be configured at the boot time of the server. When configuring A2LT 232, at least one memory portion is reserved as a spare memory portion SP. Spare memory portions SP may be distributed across different memory devices 208 and across memory devices 208 connected with different processor chips 202. The spare memory portions SP are not identified by the A2LT 232. The spare memory portions SP may be used to replace unwanted memory portions "UN" which have displayed reduced reliability. For example, a reduction of the communication capacity of a communication connection to a memory device or a link fail of a link included within the communication connection can be compensated for. A dynamic memory migration can, for example, be performed by the operating system or by a system hypervisor. The dynamic memory migration can be executed as follows:

1. Pause server use
2. Move all data from the unwanted memory portion UN to a spare memory portions SP. For example, for 2.4 GHz DIMMs the data transfer rate may be 19.2 GB/s such that a 128 GB DIMM may be moved in ≈10 seconds
3. In the A2LT 232 of the processor chips 202, a row identifying the unwanted memory portion UN is reconfigured to identify the spare memory portions SP
4. Resume server use Thus, as long as spare memory portions are available, failures of components of the main memory such as memory devices, communication connections, memory buffer chips, can be compensated for. In some embodiments, the number of spare main memory portions can be configured at boot time in accordance with a specified main memory reliability level. In some embodiments, for example, hot-plug hardware replacement or upgrades can be employed to change the number of spare memory portions. In the example of FIG. 7 the first portion of the second memory device 208 connected with the processor chip 202 could exhibit failures corresponding to educed reliability. For example, the second memory portion of the third memory device 208 connected with the chip processor 202 can be used as a spare memory portion. Thus, the row identifying the memory portion having reduced reliability can be reconfigured to identify the spare memory portion after the data has been moved from the memory portion with reduced reliability to the spare memory portion.

Figure 8:
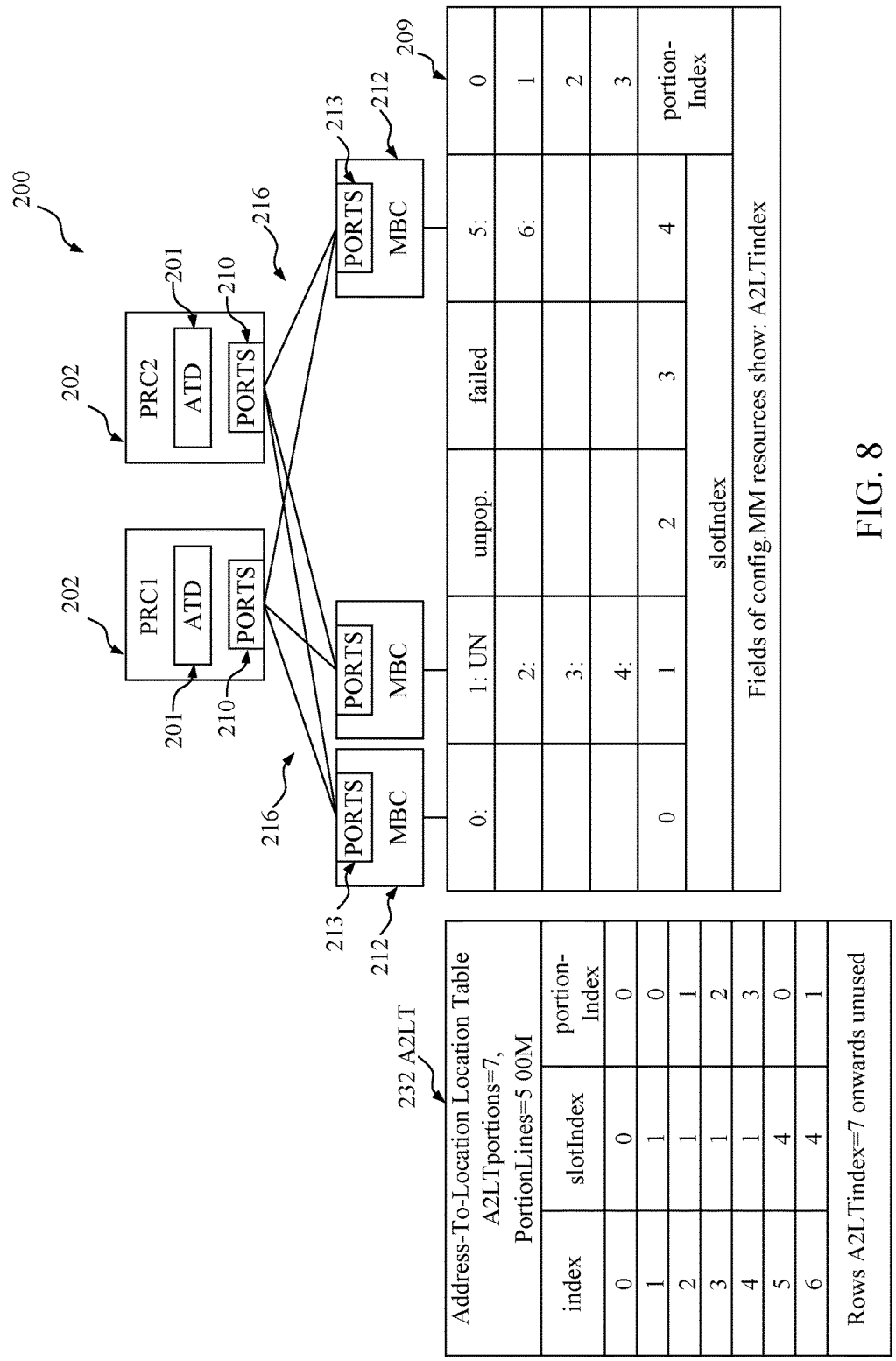
FIG. 8 is a schematic diagram illustrating a mapping between physical addresses and memory locations, according to embodiments consistent with the figures.

FIG. 8 depicts the main memory layout of FIG. 2C in more detail. For each portion of a populated memory device, the A2LTindex is depicted, which also corresponds to the address of the first location in that portion.

An address scrambling can also be used in order to statistically avoid memory device hotspots due to data access patterns of software accessing the main memory. For example, the physical addresses can be scrambled or distributed before entering the A2LT algorithm, i.e., the translation algorithm. According to some embodiments, the first row index, when executing the algorithm may be scrambled.

Address scrambling refers to an alternative layout of physical addresses onto physical main memories. Performance of a main memory can rely, at least in part, upon how well the memory subsystem serves the various application access patterns to the main memory. An access pattern may, for example, include a contiguous access pattern, also known as "stride 1". A further access pattern may be strided or have a "stride-n" access pattern with n=2, 3, 4, 5 . . . memory lines. Applications may access the main memory in a fixed stride. For example, an application may access the main memory in a 256-byte stride, where each memory line is 128 bytes. Such an application, for example, may access every second memory line of the main memory.

For integrating address scrambling, the number of memory portions of the main memory can be increased such that each memory device includes a plurality of memory portions. This may, for example, be achieved by configuring a smaller value for the number of lines per memory portion and thus configuring a greater number of memory portions such that both types of access pattern, i.e., contiguous access and strided access, are possible. In other words, more memory portions than are necessary to configure the capacity of each memory device are used.

Figure 9:
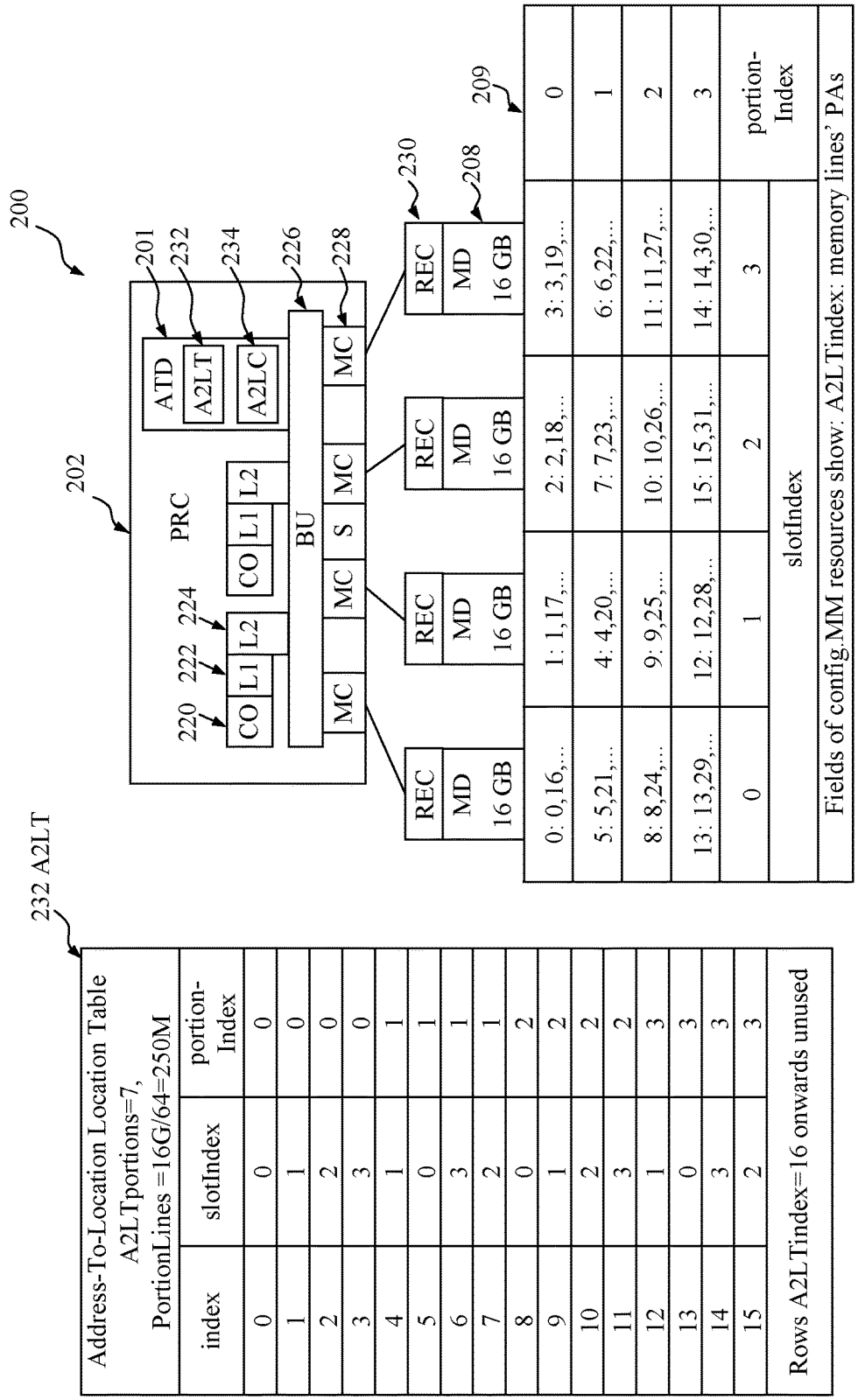
FIG. 9 is a schematic diagram illustrating a mapping between physical addresses and memory locations, according to embodiments consistent with the figures.

FIG. 9 depicts a corresponding example, wherein each of the memory devices 208 includes a plurality of memory portions. In the case of a contiguous access pattern, each pair of memory lines with consecutive physical addresses are stored in different memory devices. In the case of a stride-2 access pattern, all four memory devices 208 are accessed. The same is true in the case of a stride-3 access pattern. In the case of a stride-4 access pattern two of the four memory devices 208 are accessed.

Figure 10:
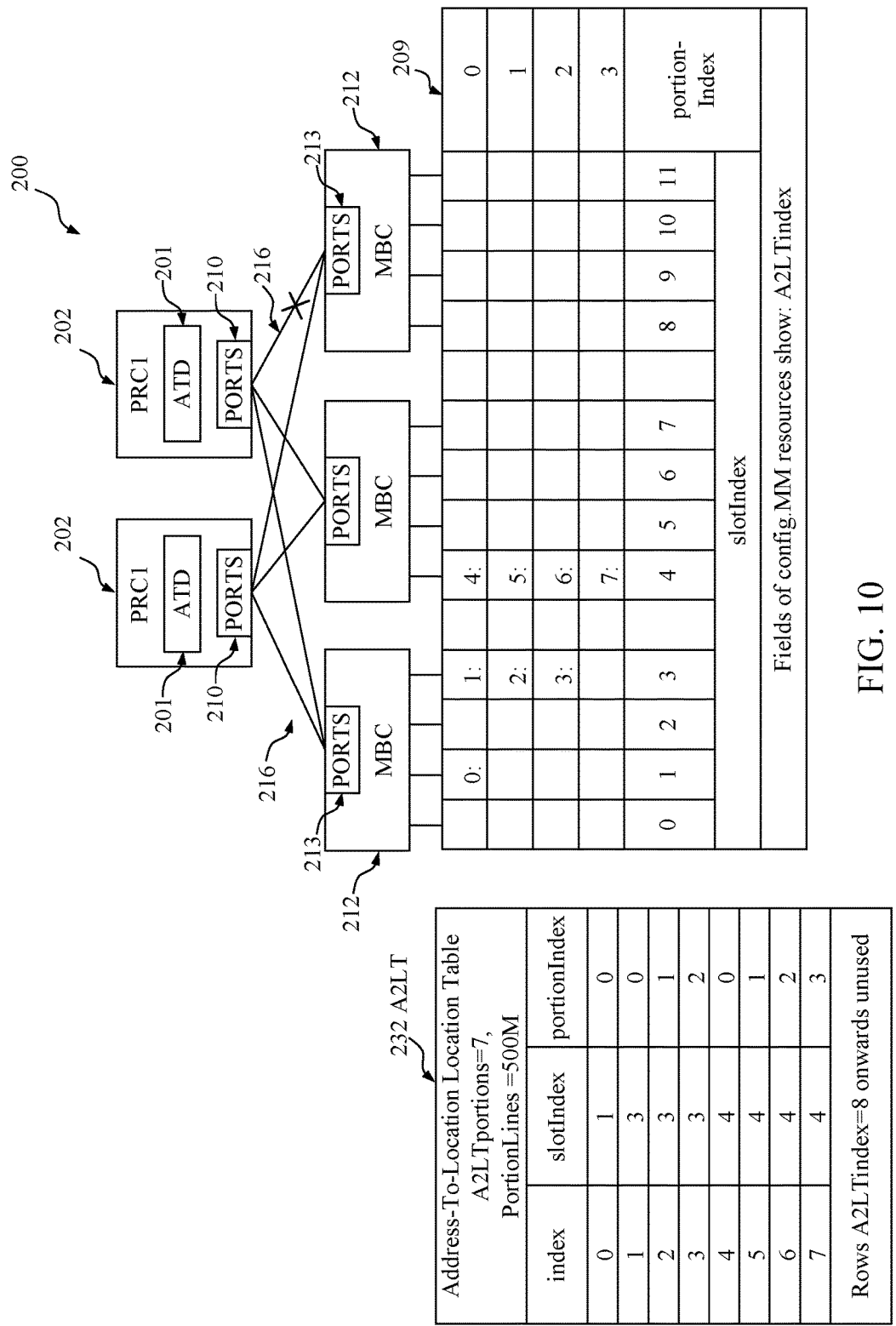
FIG. 10 is a schematic diagram illustrating a mapping between physical addresses and memory locations, according to embodiments consistent with the figures.

According to some embodiments the translation logic can be amended in order to implement address scrambling. The number of memory portions may or may not be increased. Consider a set of memory lines, where the memory portions assigned to each line of the set rotates by "n". Assume the number of memory portions included in the main memory is, e.g., 7. Starting at physical address 0, the rotation of consecutive sets is n=0, 1, 2, 3, 4, 5, 6, 0, 1, 2, 3, 4, 5, 6, . . . , while the address translation algorithm is amended as follows:
1. PA_ALTindex=(PA+floor(PA/ALTportions)) mod ALTportions
2. PA_slotIndex=ALT [PA_ALTindex].slotIndex
3. PA_offset=floor(PA/ALTportions)
4. PA_portionIndex=ALT[PA_ALTindex].portionIndex
5. PA_slotLine=PA_portionIndex*PortionLines+PA_offset The location translation algorithm may be amended as follows:
1. PA_portionIndex=floor(slotLine/PortionLines)
2. PA_L2ATindex=slotIndex*maxPortions+PA_portionIndex
3. PA_firstAddress=(L2AT[PA_L2ATindex].firstAddress+LATportions-PA_offset) mod PortionLines
4. PA_offset=PA_slotLine mod PortionLines*LATportions
5. PA=PA_firstAddress+PA_offset FIG. 10 depicts an example of a main memory layout with a failed link. For each portion of a populated memory device, the A2LTindex is depicted, which also corresponds to the address of the first location in that portion. On every processor chip 202 the A2LT 232 may be used to map out all the memory devices 208 behind a memory buffer chip 212 with a 100% (completely) failed link. For example, the third memory buffer chip 212 may have a failed link 216. In this case, the A2LT 232 of the address translation device 201 may not map to the memory devices 208 of the respective memory buffer chip 212 with the failed link 216. Considering a large memory system including, for example, 128 memory buffer chips 212, not mapping a single memory buffer chip 212 can result in a loss of memory capacity and bandwidth of approximately 1%. Considering a link 216 performing at a reduced bandwidth of "F" %, the A2LT may be used to map only F % of the memory capacity of the memory devices 208 of the respective memory buffer chip 212 connected by the link with reduced bandwidth.

For example, a multi-processor server can include two processor chips 202 and 16 memory buffer chips 212, each memory buffer chip 212 being connected with four memory devices 208. For example, each link between the processor chips 202 and the memory buffer chip 212 can include eight wires. Assuming that one wire of one of the links 216 fails, the A2LT 232 of each processor chip 202 can be used to reduce the mapping to a main memory capacity corresponding to 3.5 of the four memory devices 208 connected with the memory buffer chip 212 through the failed wire. Thus, the respective memory buffer chip 212 continues to include the original communication capacity of two wires per memory device for bandwidth per capacity.

Figure 11:
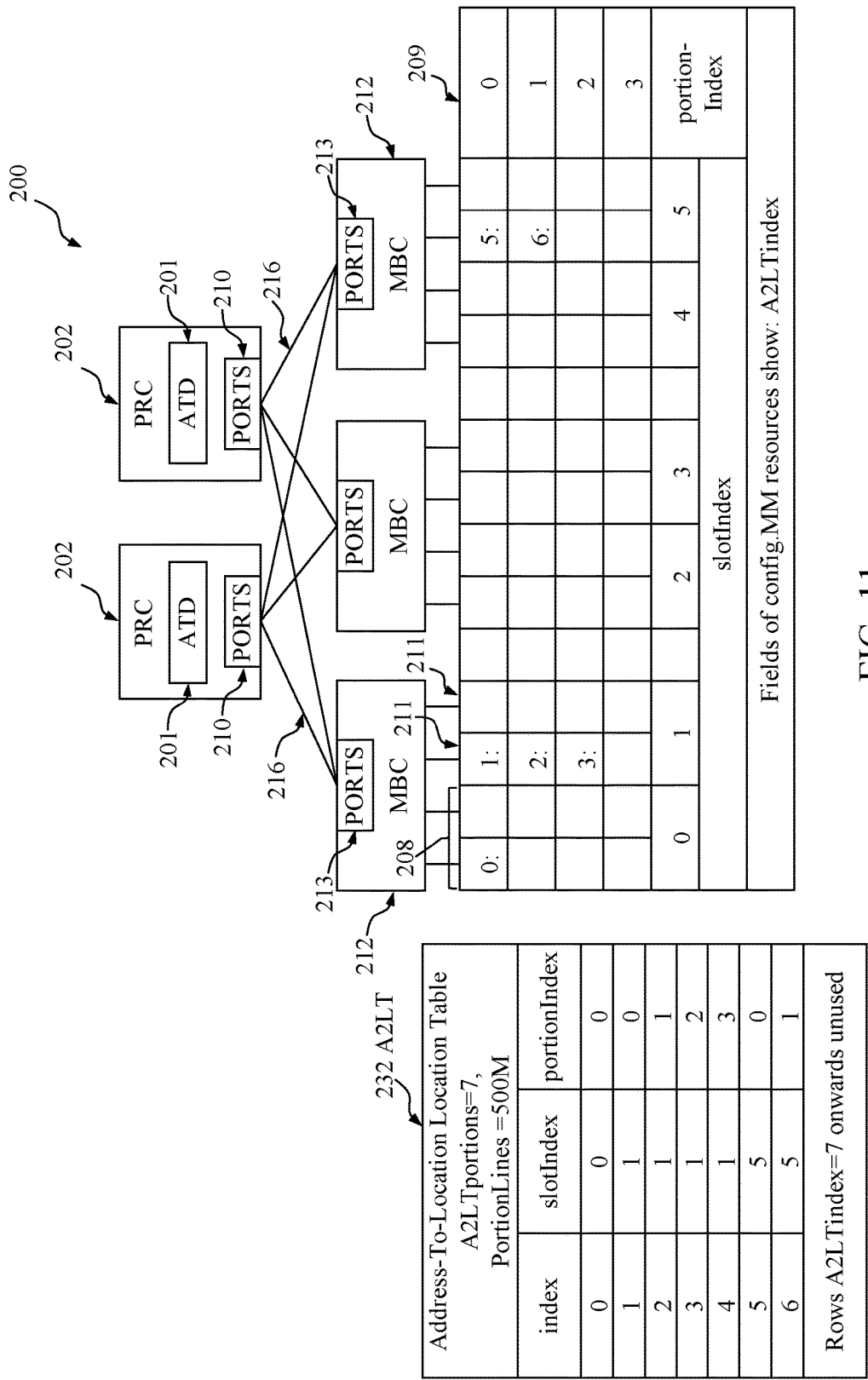
FIG. 11 is a schematic diagram illustrating a mapping between physical addresses and memory locations, according to embodiments consistent with the figures.

FIG. 11 depicts an embodiment, where each memory device 208 includes two memory components 211. Since every memory device 208 includes a pair of memory components 211 that are each individually connected with a memory buffer chip 212, a memory line can be stored within the pair of two memory components 211 instead of a single memory component 211 or memory device 208 as depicted in FIG. 10. Thus, each of the pairs of memory components 211 can be treated like a single memory device 208 in the examples described above. However, the access to the pair of memory components 211 may be faster, since both may be accessed in parallel. The two memory components 211 combined to a pair may each have the same memory capacity.

According to embodiments, each processor chip 202 can have two or more A2LTs 232. Each of the A2LTs can be configured for a different type of memory portion that includes a different number of memory lines. For example, the first part of the main memory is described by a first A2LT 232 identifying "x" memory portions. Another part of the main memory may be described by another A2LT 232 identifying "y" memory portions, wherein y is different from x. According to embodiments, a single threshold may divide the physical address space by the first A2LT from the physical address space covered by the second A2LT. Embodiments may allow movement of data from a part of main memory described by the first A2LT to a part of the main memory described by the second A2LT. If the first A2LT uses "G" memory devices 208, the second A2LT may use less than G memory devices 208. Thus, at least one memory device 208 may be released. These released memory devices 208 may be reserved as spare memory devices 208, for example for a dynamic memory migration as described above. These released memory devices 208 may be removed or replaced, for example, through a "hot-plug" process. The released memory devices 208 may be included, for example, within a single memory card, allowing that card to be removed and replaced through a hot-plug process.

According to some embodiments, the first A2LT may use G memory devices, while the second A2LT may use more than G memory devices. For example, the second A2LT may use previously free memory devices. Such a previously free memory device may be added to the memory system through a hot-plug process.

According to embodiments, a single A2LT can effectively be used as two or more effective A2LTs. Each effective A2LT requires its own configured value of memory portions and memory lines per memory portion. A physical address below a predefined threshold can use first consecutive elements of A2LT. A physical address above the predefined threshold may use the A2LT starting at a predefined row.

Figure 12:
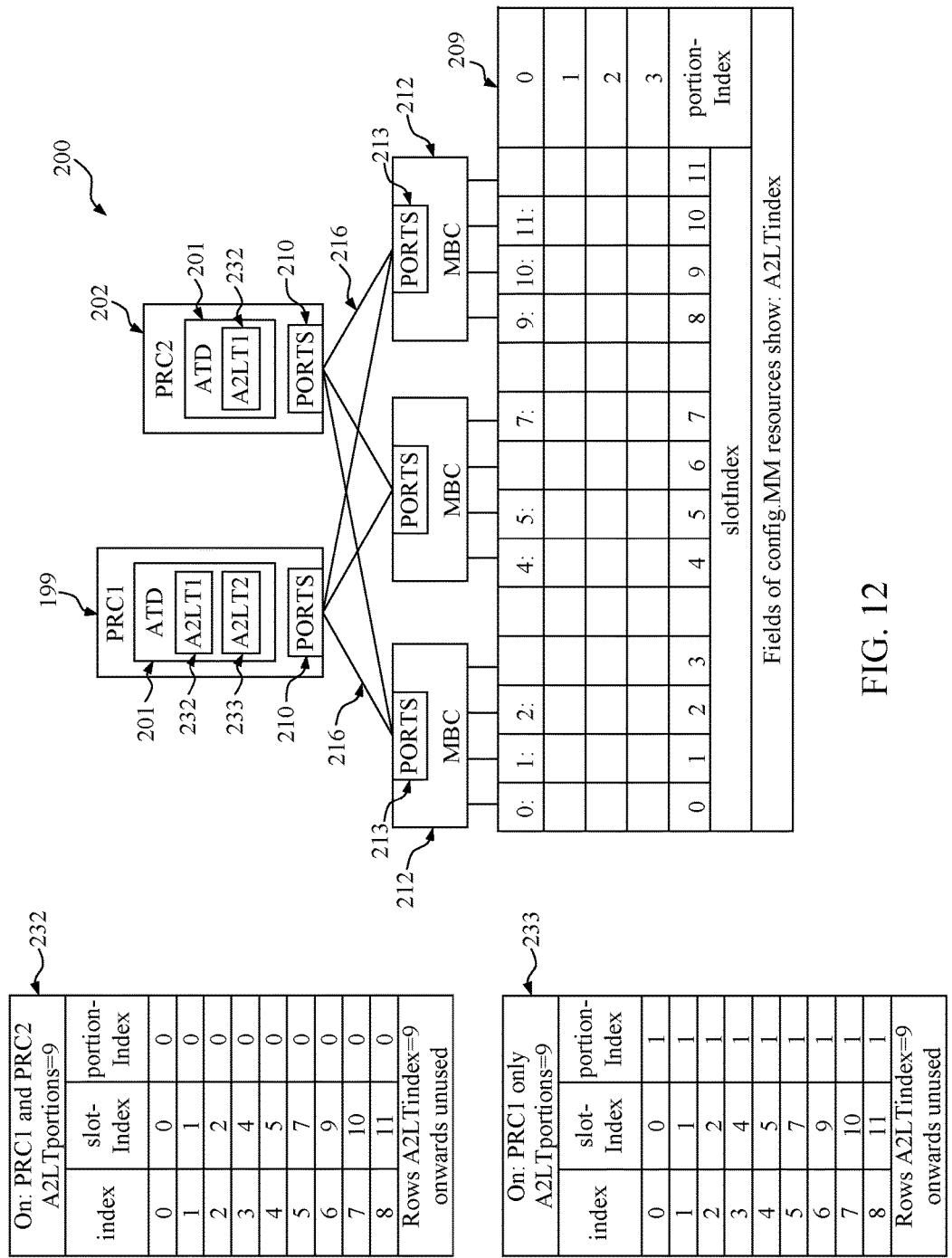
FIG. 12 is a schematic diagram illustrating a mapping between physical addresses and memory locations, according to embodiments consistent with the figures.

FIG. 12 depicts an embodiment of a main memory layout for a multi-processor server architecture. For each portion "0" of a populated memory device, the A2LTindex is depicted for A2LT1 232 that is identically configured on PRC1 199 and PRC2 202 for use by both processors. For the contiguous memory region using portion 0, the A2LTindex value also matches the address of the first location in that portion. For each portion "1" of a populated memory device, the A2LTindex is depicted for A2LT2 233 that is configured on PRC1 199 and not PRC2 202, for use by only PRC1 199. For the contiguous memory region using portion 1, the A2LTindex value also matches the address of the first location in that portion. The two processor chips 199, 202 can include A2LTs 232 that are configured differently from each other. For example, each processor chip PRC1 199 may have multiple physical and/or effective A2LTs 232. For example, both processor chips 199, 202 may have an identically configured A2LT 232 for a shared part of the main memory 204. For another part of the main memory 204, only one of the two processor chips 199, 202, e.g., PCR1 199, may include a supplemental A2LT 233, while the other processor chip 202 may not include supplement A2LT 233. Thus, part of the main memory 204 is only accessible by one of the two processor chips 199, 202 that includes the supplemental A2LT 233, while the other one of the two processor chips 199, 202 is excluded from access to the respective part of the main memory. An embodiment according to FIG. 12 may be useful in allowing different levels of security to be defined for various parts of the main memory 204.

Figure 13:
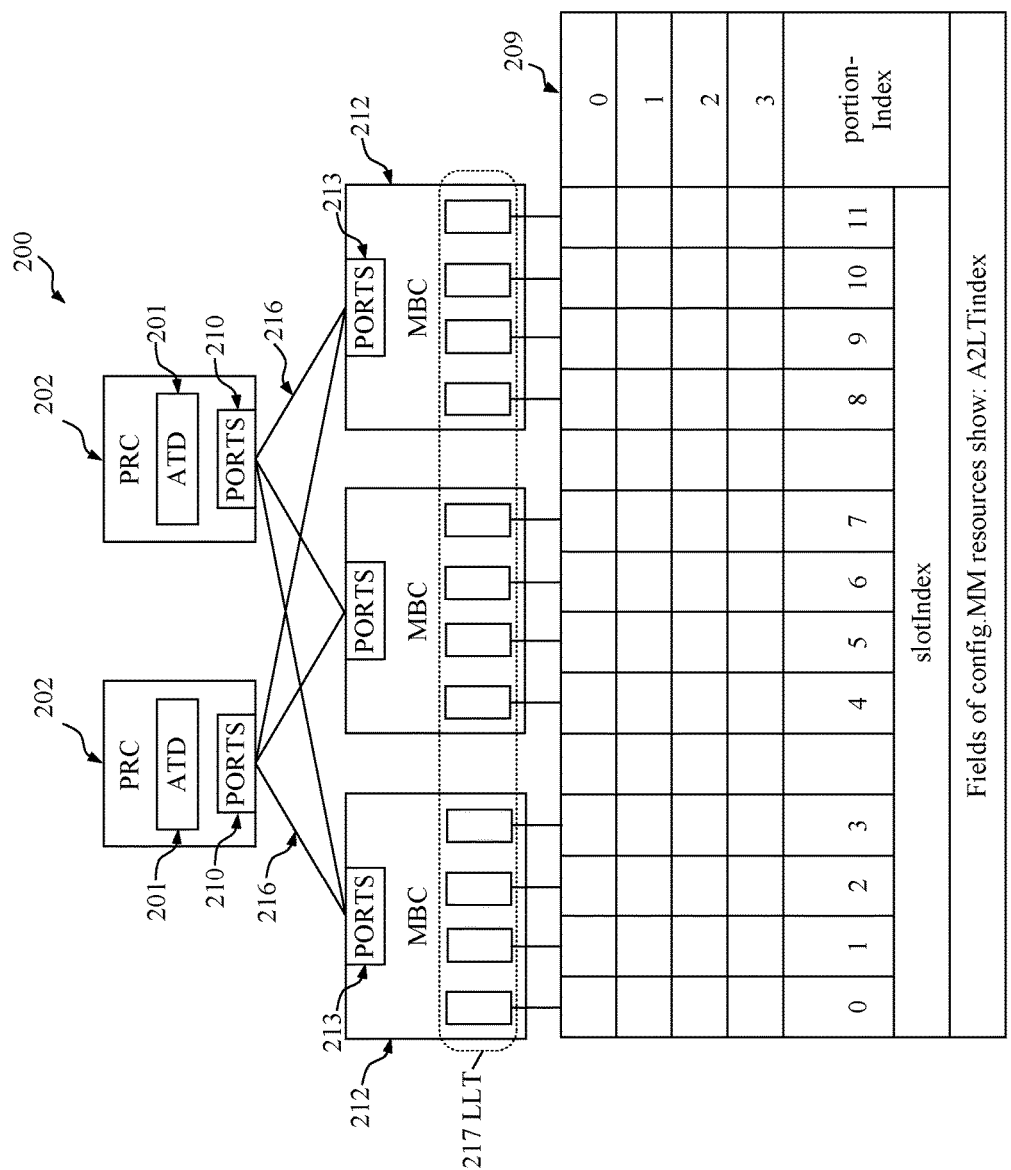
FIG. 13 is a schematic diagram illustrating a mapping between physical addresses and memory locations, according to embodiments consistent with the figures.

FIG. 13 depicts a main memory configuration for a multi-processor architecture, where the memory buffer chips 212 include at least one line location table (LLT) to map out failed memory lines. An LLT may be indexed by a memory line or by a row, column or band corresponding to memory line address, in order to filter out memory portions with reduced reliability in a memory device 208. The memory portions with reduced reliability may be filtered out by mapping identifier identifying the respective memory portions to identifier identifying the replacement memory portions with full reliability. So, an LLT with three entries may, for example, map band 0, 1, 2 to band 0, 3 and 2, respectively.

Software, e.g., an operating system or hypervisor, instructions/rules may ensure that the processor chips 202 to not use the "X %" memory capacity of each memory portion configured in the A2LTs 232 of each processor chip 202. In embodiments, the top X % memory capacity can correspond to the highest addresses in the memory portion. The unused top X % memory capacity may include spare memory lines in each memory device, which may be used in the LLT configuration.

Figure 14:
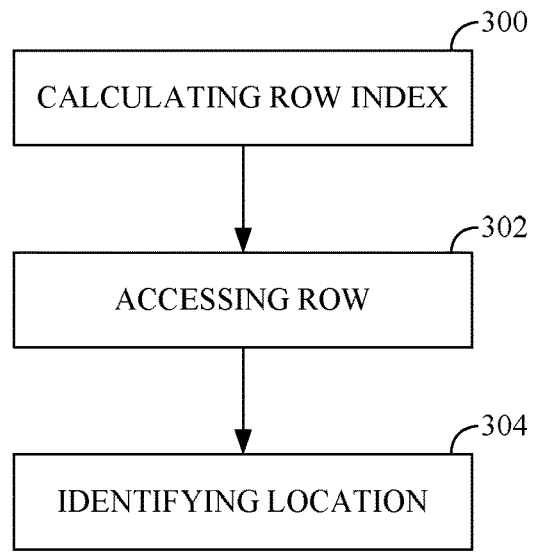
FIG. 14 is a flow diagram of a method for translating physical addresses, according to embodiments consistent with the figures.

FIG. 14 depicts a method for translating a physical address to a location within a memory device. In block 300, a row index is calculated from the physical address by an index calculation unit, e.g., using a modulo value of the physical address. The row index identifies a row of a data table structure. In operation 302, the identified row is accessed. The row includes at least one identifier for identifying the physical location within the memory device holding the memory line. In operation 304, the location within the memory device and the memory portion holding the memory line are identified using the individual row. The identification may make use of one of the algorithms described above.

Figure 15:
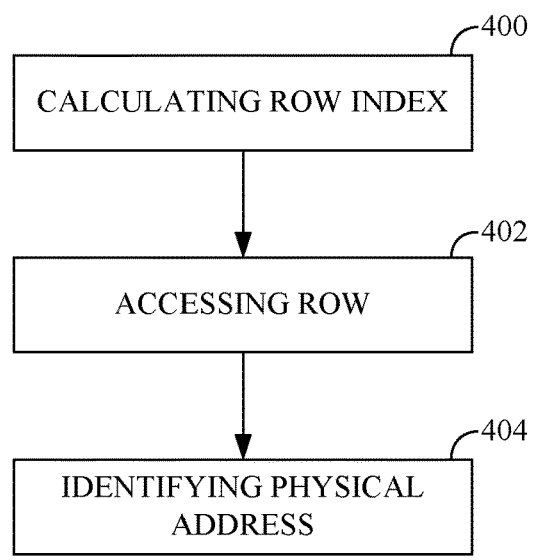
FIG. 15 is a flow diagram of a method for translating locations within memory devices, according to embodiments consistent with the figures.

FIG. 15 depicts a method for translating a location within a memory device to a physical address. In block 400, a row index is calculated from the location within the memory portion by an index calculation unit. The row index identifies a row of a data table structure. In operation 402, the identified row is accessed. The row includes at least one mapping identifier for identifying the physical address of the memory line included within the location within the memory device. In operation 404, the physical address of memory line is identified using the individual row. The identification may include one of the algorithms described above, e.g., using a modulo value.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

The present disclosure may be a system, a method, and/or a computer program product. The computer program product may include a computer-readable storage medium (or media) having computer-readable program instructions thereon for causing a processor to carry out aspects of the present disclosure.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device through a network, for example, the Internet, a local area network, a wide area network and/or a wireless network. The network may include copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of at least one programming language, including an object oriented programming language such as SmaLLTalk, C++ or the like, and conventional procedural programming languages, such as the 'C' programming language or similar programming languages. The computer-readable program instructions may execute entirely on the user computer system's computer, partly on the user computer system's computer, as a stand-alone software package, partly on the user computer system's computer and partly on a remote computer or entirely on the remote computer or server. In the latter scenario, the remote computer may be connected to the user computer system's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be readable by a processor of a general-purpose computer, special purpose computer, or other programmable data processing apparatus to produce a machine, such that the instructions, that execute through the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein includes an article of manufacture including instructions which implement aspects of the function/act specified in the flowchart and/or block diagram block or blocks.

The computer-readable program instructions may also be loaded onto a computer, other programmable data processing apparatus, or other device to cause a series of operations to be performed on the computer, other programmable apparatus or other device to produce a computer-implemented process, such that the instructions that execute on the computer, other programmable apparatus, or other device implement the functions/acts specified in the flowchart and/or block diagram block or blocks.

The flowchart and block diagrams in the FIGs. illustrate the architecture, functionality, and operation of possible implementations of systems, methods, and computer program products according to various embodiments of the present disclosure. In this regard, each block in the flowchart or block diagrams may represent a module, segment, or portion of instructions, which includes at least one executable instruction for implementing the specified logical function(s). In some alternative implementations, the functions noted in the block may occur out of the order noted in the figures. For example, two blocks depicted in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Other variations to the disclosed embodiments can be understood and effected by those skilled in the art in practicing the claimed disclosure, from a study of the drawings, the disclosure, and the appended claims. In the claims, the word "comprising" does not exclude other elements or operations, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method for translating, within a main memory of a computer system, a physical address of a memory line to a storage location of the memory line, the main memory including a plurality of memory devices, each memory device of the plurality memory devices having a respective memory capacity, each of the respective memory capacities including at least one contiguous memory portion of a uniform size, the memory line being stored in one of the at least one contiguous memory portions, the method comprising:

calculating, with a first index calculation unit, for the physical address, a first row index that identifies, within a first data table structure having a set of consecutive rows, wherein each row of the set of consecutive rows is configured to uniquely identify one of the at least one contiguous memory portions, a row of the first data table structure that identifies a memory portion, of the at least one contiguous memory portions, that includes the storage location of the memory line.

2. The method of claim 1, further comprising:
accessing the row identified by the first row index, the row including at least one field value for calculating the storage location of the memory line within the main memory; and
calculating, with the first index calculation unit and using the at least one field value, the storage location of the memory line within the main memory.

3. The method of claim 1, wherein each row of the set of consecutive rows includes a respective memory device identifier that identifies one memory device of the plurality memory devices and a respective memory portion identifier that identifies a contiguous memory portion of the one memory device.

4. The method of claim 1, wherein the first index calculation unit is further configured to calculate, for the physical address, a memory line offset within the contiguous memory portion identified by the row of the first row index.

5. The method of claim 1, wherein the first data table structure and the first index calculation unit are configured so that a set of memory lines are distributed over the at least one contiguous memory portions so that two memory lines of the set of memory lines that have consecutive physical addresses are stored in memory portions of the at least one contiguous memory portion of two different memory devices of the plurality memory devices.

6. The method of claim 1, wherein the first data table structure and the first index calculation unit are configured so that a set of memory lines are distributed over the at least one contiguous memory portions so that memory lines of the set of memory lines that have consecutive physical addresses are distributed across the plurality of memory devices.

7. The method of claim 1, wherein, for translating, within the main memory of the computer system, the storage location of the memory line to the physical address, the method further comprises:
calculating, with a second index calculation unit, for the location, a second row index that identifies, from a second data table structure configured so that each memory portion of the at least one contiguous memory portions is uniquely assigned to a corresponding second row of the second data table structure, wherein each corresponding row identifies a physical address of at least one memory line of a set of memory lines stored in the memory portion, the corresponding second row of the second data table structure that is assigned to a memory portion of the at least one contiguous memory portions that includes the storage location of the memory line.

8. The method of claim 7, wherein the physical address identified by the second row of the second row index is a physical address of a memory line stored at the beginning of the memory portion assigned to the corresponding second row.

9. The method of claim 7, wherein the second index calculation unit is further configured to calculate the location the physical address of at least one memory line of a set of memory lines using the physical address identified by the second row of the calculated second row index.

10. The method claim 1, wherein the memory capacity of a smallest memory device of the plurality of memory devices is equal to the uniform size of the at least one contiguous memory portion.

11. The method of claim 1, wherein the memory capacity of a smallest memory device of the plurality of memory devices equals an integer multiple of the uniform size of the at least one contiguous memory portion.

12. The method of claim 1, wherein the main memory includes a spare memory portion not identified by one of the rows of the first data table structure, wherein, in response to receiving an indication that a memory portion of the main memory, identified by a row of the first data table structure, has reduced reliability, the method further comprises:
copying data stored in the memory portion having reduced reliability to the spare memory portion; and
reconfiguring, to identify the spare memory portion, a row identifying the memory portion having reduced reliability.

13. The method of claim 1, wherein, in response to receiving an indication of reduced reliability of a communication connection to a memory device, the method further comprises removing, from the first data table structure, all rows that identify a memory portion within the respective memory device.

14. The method of claim 1, wherein, in response to receiving an indication of reduced reliability of a communication connection to a memory device, the method further comprises removing, from the first data table structure, a number of rows, proportional to the degree of reduction of the communication capacity, that identify memory portions of the respective memory device.

* * * * *